US009064598B1

(12) United States Patent
Hirai et al.

(10) Patent No.: US 9,064,598 B1
(45) Date of Patent: Jun. 23, 2015

(54) NONVOLATILE SEMICONDUCTOR MEMORY DEVICE

(71) Applicant: Kabushiki Kaisha Toshiba, Minato-ku (JP)

(72) Inventors: Ryota Hirai, Yokohama (JP); Yasuhiro Shiino, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/289,741

(22) Filed: May 29, 2014

(30) Foreign Application Priority Data

Mar. 6, 2014 (JP) .................................. 2014-043990

(51) Int. Cl.
*G11C 16/34* (2006.01)
*G11C 16/14* (2006.01)
*G11C 16/04* (2006.01)

(52) U.S. Cl.
CPC ............. *G11C 16/3445* (2013.01); *G11C 16/14* (2013.01); *G11C 16/0483* (2013.01)

(58) Field of Classification Search
CPC .......................... G11C 16/3445; G11C 16/345
See application file for complete search history.

(56) References Cited

U.S. PATENT DOCUMENTS

| 7,266,019 B2 * | 9/2007 | Taoka et al. .............. 365/185.29 |
| 7,532,520 B2 | 5/2009 | Yanagidaira et al. |
| 8,514,627 B2 * | 8/2013 | Itagaki et al. ............ 365/185.18 |
| 8,861,282 B2 * | 10/2014 | Dutta et al. .............. 365/185.29 |
| 2013/0329496 A1 * | 12/2013 | Lee et al. ................. 365/185.11 |
| 2014/0334232 A1 * | 11/2014 | Nam et al. ............... 365/185.17 |

FOREIGN PATENT DOCUMENTS

| JP | 8-007597 | 1/1996 |
| JP | 2008-047273 | 2/2008 |
| JP | 2011-165278 | 8/2011 |
| JP | 2013-054798 | 3/2013 |
| JP | 2013-145623 | 7/2013 |

* cited by examiner

*Primary Examiner* — Harry W Byrne
*Assistant Examiner* — Lance Reidlinger
(74) *Attorney, Agent, or Firm* — Oblon, McClelland, Maier & Neustadt, L.L.P.

(57) ABSTRACT

A nonvolatile semiconductor memory device according to one embodiment comprises: a memory cell array comprising a plurality of NAND strings, each NAND string comprising a memory string comprising a plurality of memory cells and a dummy transistor; a plurality of word lines; a dummy word line; a plurality of bit lines; a source line; and a control circuit performing an erase sequence, the erase sequence repeating an erase operation to the memory cells and the dummy transistor and an erase verify operation of confirming whether the memory cells and the dummy transistor are changed to an erased state. The control circuit is configured to be able to perform, when the erase verify operation is unpassed, a dummy transistor erase operation of selectively changing the dummy transistor to an erased state and a dummy transistor erase verify operation of confirming whether the dummy transistor is changed to an erased state.

20 Claims, 16 Drawing Sheets

NONVOLATILE SEMICONDUCTOR MEMORY DEVICE

CROSS REFERENCE TO RELATED APPLICATION

This application is based upon and claims the benefit of priority from prior Japanese Patent Application No. 2014-43990, filed on Mar. 6, 2014, the entire contents of which are incorporated herein by reference.

BACKGROUND

1. Field

The present embodiments relate to a nonvolatile semiconductor memory device.

2. Description of the Related Art

As an electrically rewritable and highly integratable nonvolatile semiconductor memory device, a NAND flash memory is known. The memory cells of the NAND flash memory each include a semiconductor substrate, a charge accumulation layer formed on the substrate via a tunnel insulating film, and a control gate stacked on the charge accumulation layer via an inter-gate dielectric film. Each memory cell stores data in a nonvolatile manner using the charge accumulation state of the charge accumulation layer.

The NAND flash memory performs, after an erase operation of the memory cells, an erase verify operation of verifying whether the memory cells are erased to a desired state. If the erase verify operation cannot be performed correctly, the memory cells will be applied repeatedly with the erase voltage, which may degrade the memory cells.

DETAILED DESCRIPTION

A nonvolatile semiconductor memory device according to one embodiment comprises: a memory cell array comprising a plurality of NAND strings arranged therein, each NAND string comprising a memory string comprising a plurality of memory cells connected in series, and a dummy transistor connected to at least one of two ends of the memory string; a plurality of word lines connected to respective control gate electrodes of the memory cells; a dummy word line connected to a control gate electrode of the dummy transistor; a plurality of bit lines connected to respective first ends of the NAND strings; a source line connected to second ends of the NAND strings; and a control circuit performing an erase sequence, the erase sequence repeating an erase operation to the memory cells and the dummy transistor and an erase verify operation of confirming whether the memory cells and the dummy transistor are changed to an erased state. The control circuit is configured to be able to perform, when the erase verify operation is unpassed, a dummy transistor erase operation of selectively changing the dummy transistor to the erased state and a dummy transistor erase verify operation of confirming whether the dummy transistor is changed to the erased state.

With reference now to the drawings, nonvolatile semiconductor memory devices according to the present embodiments will be described.

First Embodiment

Figure 1:
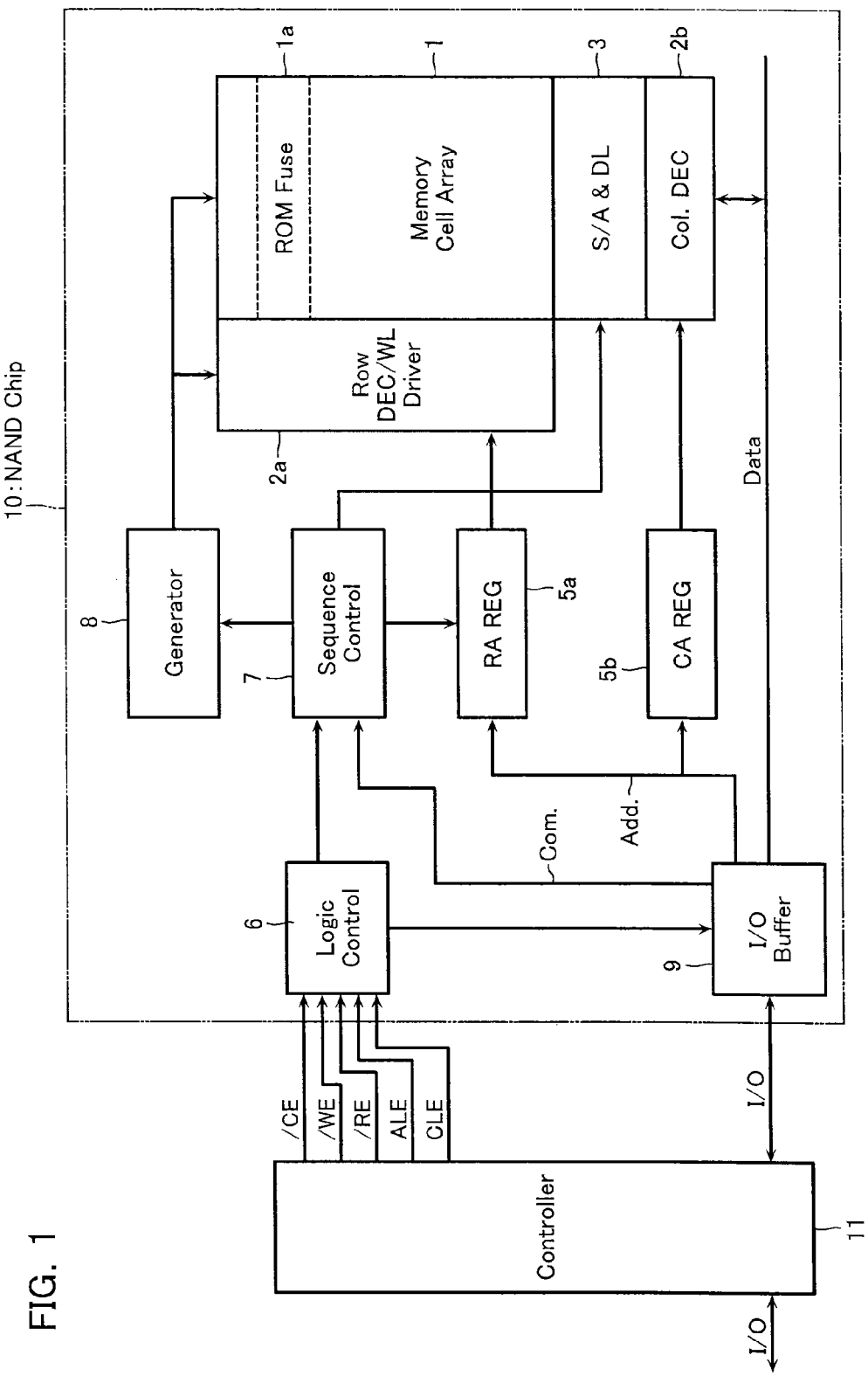
FIG. 1 is a block diagram of a nonvolatile semiconductor memory device according to a first embodiment.

First, the entire configuration of a nonvolatile semiconductor memory device according to a first embodiment will be described. FIG. 1 is a block diagram of the nonvolatile semiconductor memory device according to this embodiment.

A NAND flash memory includes a NAND chip 10 and a controller 11 for controlling the NAND chip 10. The NAND chip 10 includes a memory cell array 1. The memory cell array 1 includes a plurality of floating gate memory cells arranged in a matrix. Each memory cell includes a semiconductor substrate, a charge accumulation layer formed on the substrate via a tunnel insulating film, and a control gate stacked on the charge accumulation layer via an inter-gate dielectric film. The memory cell array 1 may include, as necessary, a ROM fuse region 1a inaccessible to a user. The ROM fuse region 1a stores various types of information used for the control of the device such as in the data write.

The memory cell array 1 includes therearound a row decoder/word line driver 2a, a column decoder 2b, a sense amplifier/latch circuit 3, a logic control circuit 6, a sequence control circuit 7, and a voltage generation circuit 8. The row decoder/word line driver 2a, the column decoder 2b, the sense amplifier/latch circuit 3, the logic control circuit 6, the sequence control circuit 7, and the voltage generation circuit 8 form a control circuit. They write or read data from the memory cell array 1 in units of a page.

The row decoder/word line driver 2a drives a word line and a select gate line of the memory cell array 1. The sense amplifier/latch circuit 3 includes a sense amplifier circuit S/A and a data holding circuit DL that provide one-page data. The sense amplifier/latch circuit 3 provides one-page read data. The read data is sequentially column selected by the column decoder 2b and then output to an external I/O terminal via an I/O buffer 9. The I/O terminal provides write data. The write data is selected by the column decoder 2b and then loaded into the sense amplifier/latch circuit 3. One-page write data is loaded into the sense amplifier/latch circuit 3. A row address signal and a column address signal are input via the I/O buffer 9 and then transferred to the row decoder 2a and the column decoder 2b, respectively. A row address register 5a holds an erase block address in an erase operation and holds a page address in a write operation or a read operation. A column address register 5b receives a start column address for loading the write data before starting the write operation and a start column address for the read operation. Until a write enable signal/WE and a read enable signal/RE are changed in a predetermined condition, the column address register 5b stores the input column addresses.

The logic control circuit 6 controls, on the basis of control signals including a chip enable signal/CE, a command latch enable signal CLE, an address latch enable signal ALE, the write enable signal/WE, and the read enable signal/RE, the input of the command and address and the input/output of data. The read operation and the write operation are performed with commands. In response to a command, the sequence control circuit 7 performs a sequence control of the read operation and the write or erase operation. The voltage generation circuit 8 is controlled by the sequence control circuit 7 to generate predetermined voltages necessary for various operations.

A controller 11 controls the data write and read in a condition suitable for the current write state of the NAND chip 10. Note that a portion of the write operation may be performed on the NAND chip 10 side.

[Memory Cell Array]

Figure 2:
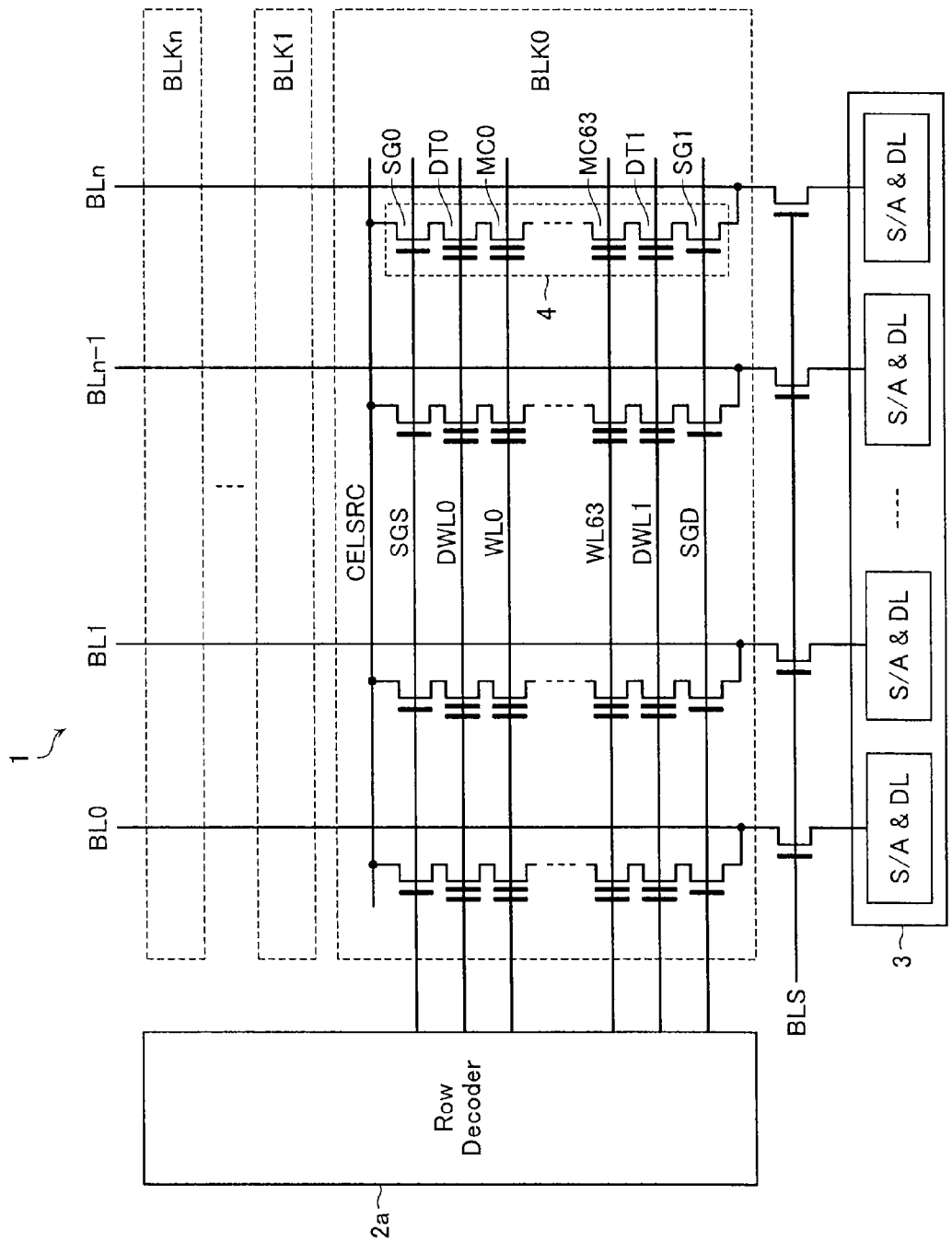
FIG. 2 is a circuit diagram of a memory cell array and peripheral circuits of the nonvolatile semiconductor memory device according to the first embodiment.
Figure 3:
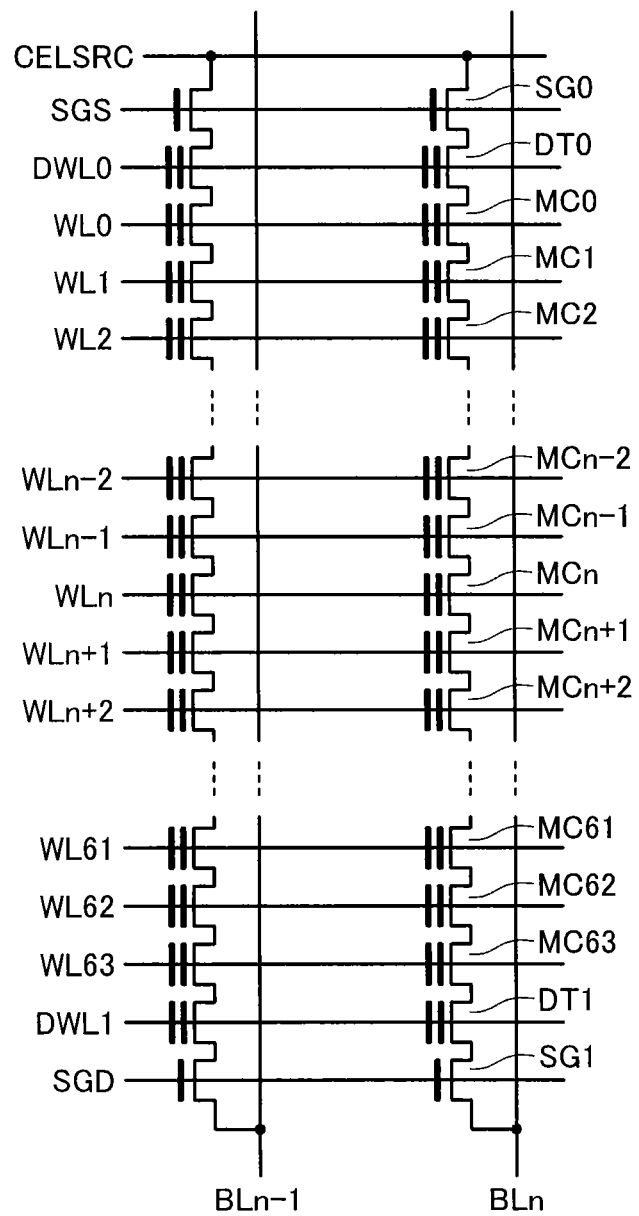
FIG. 3 is a circuit diagram of the memory cell array of the nonvolatile semiconductor memory device according to the first embodiment.

Next, a description is given of the memory cell array 1 and the sense amplifier/latch circuit 3 of the nonvolatile semiconductor memory device according to this embodiment. FIG. 2 is a circuit diagram showing the memory cell array 1 and the peripheral circuits. FIG. 3 is a circuit diagram showing the memory cell array 1.

With reference to FIGS. 2 and 3, a NAND string 4 includes a memory string including 64 memory cells MC0 to MC63 connected in series, dummy transistors DT0 and DT1 connected to the respective two ends of the memory string, and select gate transistors SG0 and SG1 connected to the respective dummy transistors DT0 and DT1. The select gate transistor SG0 has a source connected to a common source line CELSRC. The select gate transistor SG1 has a drain connected to a bit line BL (BL0 to BLn). The memory cells MC0 to MC63 have control gate electrodes connected to respective word lines WL (WL0 to WL63). The dummy transistors DT0 and DT1 have gate electrodes connected to respective dummy word lines DWL0 and DWL1. The select gate transistors SG0 and SG1 have gate electrodes connected to respective select gate lines SGS and SGD. The number of dummy transistors DT connected to each end of the memory string is not limited to one. Arbitrary number of dummy transistors DT may be provided. Alternatively, only one end of the memory string may be connected to the dummy transistors DT.

The range of a plurality of memory cells MC along one word line WL is a page as the unit for collectively reading and writing data. In addition, the range of a plurality of NAND strings 4 arranged in the word line WL direction forms a block BLK as the unit for collectively erasing data. In FIG. 2, a plurality of blocks BLK0 to BLKn sharing each bit line BL are arranged in the bit line BL direction, thus forming the memory cell array 1. The word lines WL, the dummy word lines DWL, and the select gate lines SGS and SGD are driven by the row decoder/word line driver 2a.

[Data Storage States of Memory Cells]

Figure 4:
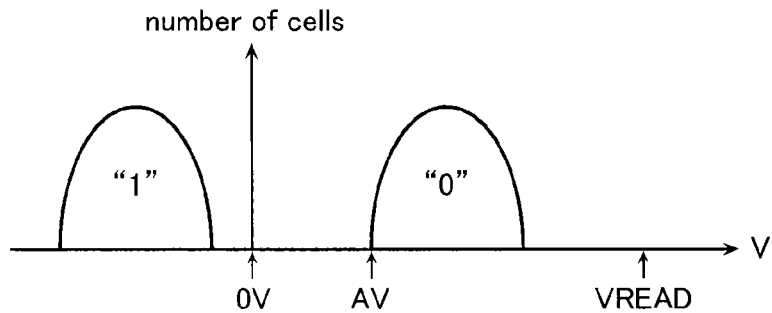
FIG. 4 shows the threshold voltage distributions of the memory cells of the nonvolatile semiconductor memory device according to the first embodiment.
Figure 4:
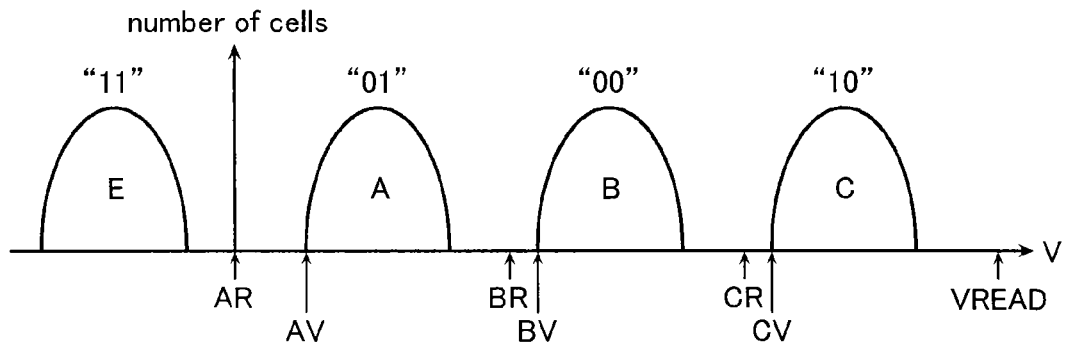

Next, the data storage state of the memory cells of the NAND flash memory according to this embodiment will be described. FIG. 4 shows the threshold voltage distributions of each memory cell MC of the NAND flash memory according to this embodiment.

If each memory cell MC of the NAND flash memory stores binary data (1-bit/cell), the threshold voltage distributions of data are as shown by A: binary data storage in FIG. 4. The threshold voltage in the negative state corresponds to data "1" (erased state), and the threshold voltage in the positive state corresponds to data "0".

In addition, when each memory cell MC of the NAND flash memory stores four-level data (2-bit/cell), the threshold voltage distributions of data is as shown by B: four-level data storage in FIG. 4. In this case, from the lowest threshold voltage, four types of threshold voltage distributions are provided (E, A, B, and C). These threshold voltage distributions are allocated four sets of data "11", "01", "00", and "10", respectively. Here, the threshold voltage distribution E is a negative threshold voltage state obtained by the collective block erase in the erase operation. In addition, voltages AR, BR, and CR between the threshold voltage distributions are determination voltages in the read operation. The lower limit voltages AV, BV, and CV of the positive threshold voltage distributions are determination voltages in the write verify operation. In addition, a voltage VREAD is a voltage higher than the upper limit of the highest threshold voltage distribution C. The read pass voltage VREAD is a voltage applied to the non-selected word lines WL in the read operation or in the write verify operation.

[Erase Sequence]

Figure 5:
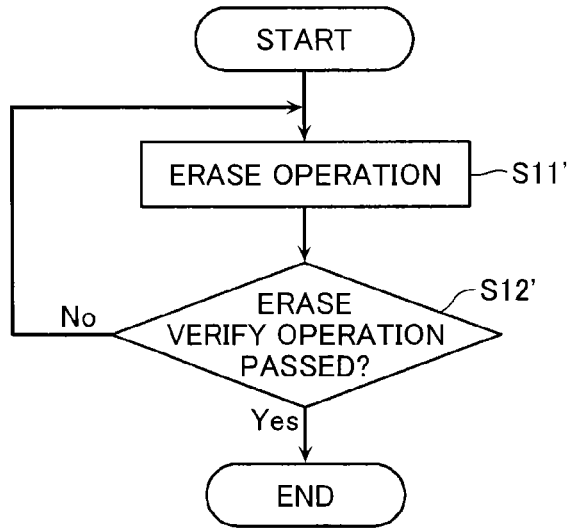
FIG. 5 is a flowchart of an erase sequence of a nonvolatile semiconductor memory device according to a comparative example.

Now, as a basis to describe the erase sequence of the non-volatile semiconductor memory device according to this embodiment, an erase sequence in a comparative example of this embodiment (hereinafter referred to as "the comparative example") will be described. FIG. 5 shows a flow of the erase sequence in the comparative example.

First, in step S11', the erase operation of changing the threshold voltage of the memory cells MC to the erased state is performed.

Figure 6:
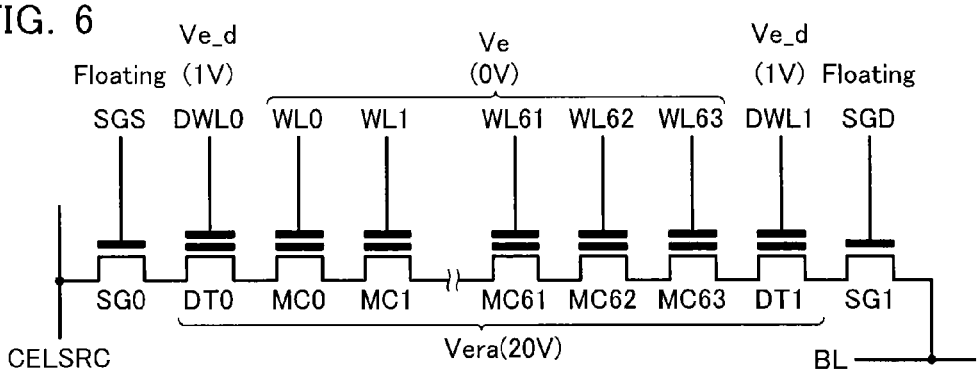
FIG. 6 illustrates applied voltages in an erase operation of the nonvolatile semiconductor memory device.

FIG. 6 shows the voltage application condition of the memory cell array 1 in the erase operation. The erase operation is performed in units of a block BLK. In the erase operation, the sequence control circuit 7 controls the voltage generation circuit 8 to apply an erase voltage Vera (about 10 V to 30 V, 20 V in FIG. 6) to the well in which the memory cells MC are formed. In addition, the sequence control circuit 7 controls the voltage generation circuit 8 to apply a voltage Ve (0 V in FIG. 6) via the row decoder/word line driver 2a to all word lines WL in a selected block BLK. Thus, electrons accumulated in the charge accumulation layer of each memory cell MC are discharged to the well side by the FN tunnel current. Note that for a charge trap type charge accumulation layer, holes are injected from the well side.

In addition, if the memory cell array 1 includes the dummy word lines DWL, the dummy word lines DWL0 and DWL1 may be applied with a voltage Ve_d (1 V in FIG. 6) higher than the voltage applied to the word lines WL, as shown in FIG. 6. This voltage is a stress reduction voltage intended to reduce the stress in the erase operation for the dummy transistors DT0 and DT1.

Next, in step S12', the erase verify operation of confirming that the memory cells MC are in the erased state is performed.

Figure 7:
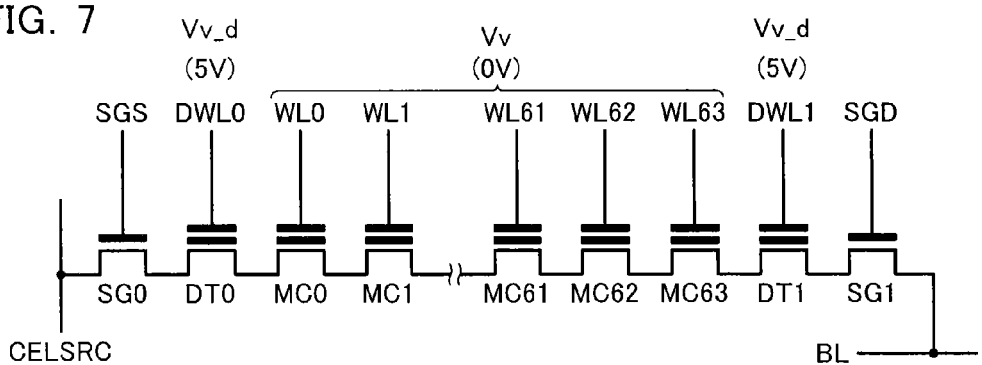
FIG. 7 illustrates applied voltages in an erase verify operation of the nonvolatile semiconductor memory device.

FIG. 7 shows the voltage application condition of the memory cell array 1 in the erase verify operation. In the erase verify operation, the sequence control circuit 7 controls the voltage generation circuit 8 to apply a word line verify voltage Vv (0 V in FIG. 7) to all word lines WL. The word line verify voltage Vv is higher than the threshold voltage of the erased state of the memory cells MC. Then, the select gate lines SGS and SGD are turned on and the common source line CELSRC is applied with a positive voltage. The sense amplifier circuit S/A then detects the charge state of the bit lines BL. The charge state is based on the current flowing from the common source line CELSRC side to the NAND string 4. The sense amplifier circuit S/A thus confirms whether the memory cells MC are changed to the threshold voltage distribution of the erased state.

In addition, if the memory cell array 1 includes the dummy word lines DWL, the dummy word lines DWL0 and DWL1 are applied with a dummy word line read pass voltage Vv_d (5 V in FIG. 7). The dummy word line read pass voltage Vv_d is large enough to render conductive the dummy transistors DT0 and DT1. In the erase verify operation, the dummy word lines DWL0 and DWL1 are applied with the positive voltage Vv_d that is higher than the word line verify voltage Vv applied to the word lines WL. Here, in the read operation or the write verify operation, the read pass voltage applied to the word lines WL is the voltage VREAD that is equal to or more than the highest threshold voltage that each memory cell MC may take. Because, however, the dummy transistors DT0 and DT1 have a threshold voltage close to the erased state in step S11', the dummy word line read pass voltage Vv_d may not be as large as the read pass voltage VREAD in the read operation or the write verify operation to be able to render conductive the dummy transistors DT0 and DT1. Thus, the electrical stress of the dummy transistors DT0 and DT1 in the erase verify operation may be reduced.

In step S12', it is confirmed whether the erase verify operation is passed, and when the erase verify operation is unpassed, then the erase operation in step S11' and the erase verify operation in step S12' are performed again. Meanwhile, when the erase verify operation is passed, then the erase sequence is ended.

The above erase sequence may set all memory cells MC to the erased state in theory. Actually, however, the degradation of the dummy transistors DT0 and DT1 cause the following problems.

When the write/erase operation is repeated, the dummy transistors DT0 and DT1 near the ends of the NAND string 4 are degraded due to the voltages applied to the select gate transistors SG0 and SG1 or the like.

When the dummy transistors DT0 and DT1 are degraded, it is hard to reduce their threshold voltage even with the erase operation. Therefore, with reference to FIG. 7, in the erase verify operation, the dummy transistors DT0 and DT1 may not be rendered conductive even when they are applied with the dummy word line read pass voltage Vv_d. In this way, the dummy transistors DT0 and DT1 are not used for the data hold, but adversely affect the erase verify operation when they are degraded.

Figure 8:
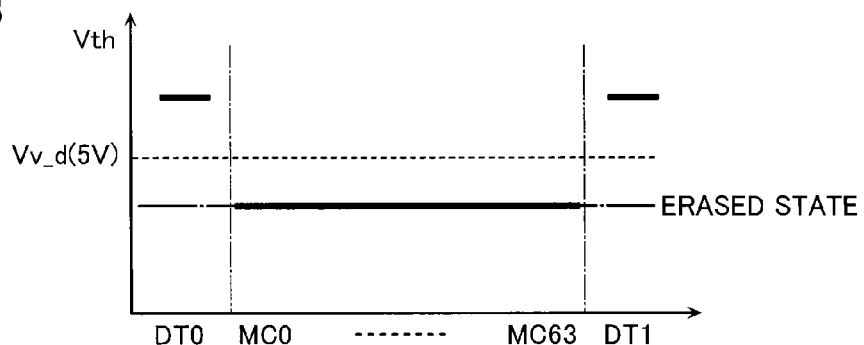
FIG. 8 shows a threshold voltage of the erase sequence of the nonvolatile semiconductor memory device according to the comparative example.

FIG. 8 shows the threshold voltages of the memory cells MC0 to MC63 and the dummy transistors DT0 and DT1 in the erase verify operation in the erase sequence of the comparative example. With reference to FIG. 8, when the dummy transistors DT0 and DT1 are not rendered conductive by the dummy word line read pass voltage Vv_d, the erase verify operation is unpassed even when the memory cells MC0 to MC63 are in the erased state.

In this case, until the threshold voltage of the dummy transistors DT0 and DT1 falls below the dummy word line read pass voltage Vv_d, the erase operation and the erase verify operation are repeated. Even when the memory cells MC0 to MC63 are in the erased state, the erase operation is repeated, so that the memory cells MC0 to MC63 experience excessive stress. As a result, the memory cells MC0 to MC63 are degraded, which reduces the reliability of data held in the memory cells MC0 to MC63.

Figure 9:
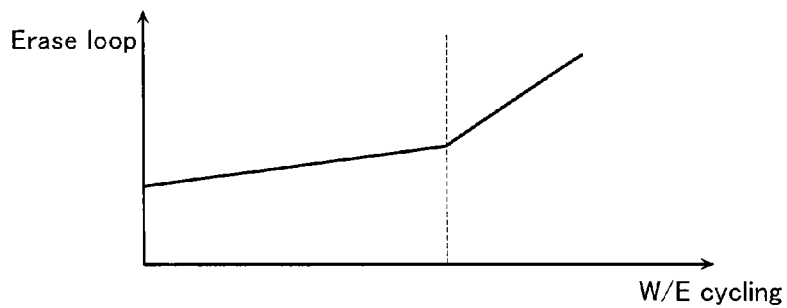
FIG. 9 shows the number of erase operation loops of the erase sequence of the nonvolatile semiconductor memory device according to the comparative example.

FIG. 9 shows the number of times the erase operation is repeated in the erase sequence in the comparative example. With reference to FIG. 9, the y-axis shows the number of loops for which the erase operation is repeated in one erase sequence, and the x-axis shows the number of times the write/erase cycle is repeated to the memory cell array 1.

With reference to FIG. 9, when the number of write/erase operations is low, the number of loops for which the erase operation is repeated in the erase sequence increases slowly due to the degradation of the memory cells MC. However, as the number of write/erase operations increases, the number of loops for which the erase operation is repeated in the erase sequence increases rapidly due to the degradation of the dummy transistors DT.

To solve this problem, the nonvolatile semiconductor memory device according to this embodiment performs an erase sequence as described below. With reference to FIGS. 10 to 15, the erase sequence of the nonvolatile semiconductor memory device according to this embodiment will be described below.

[Erase Sequence According to First Embodiment]

Figure 10:
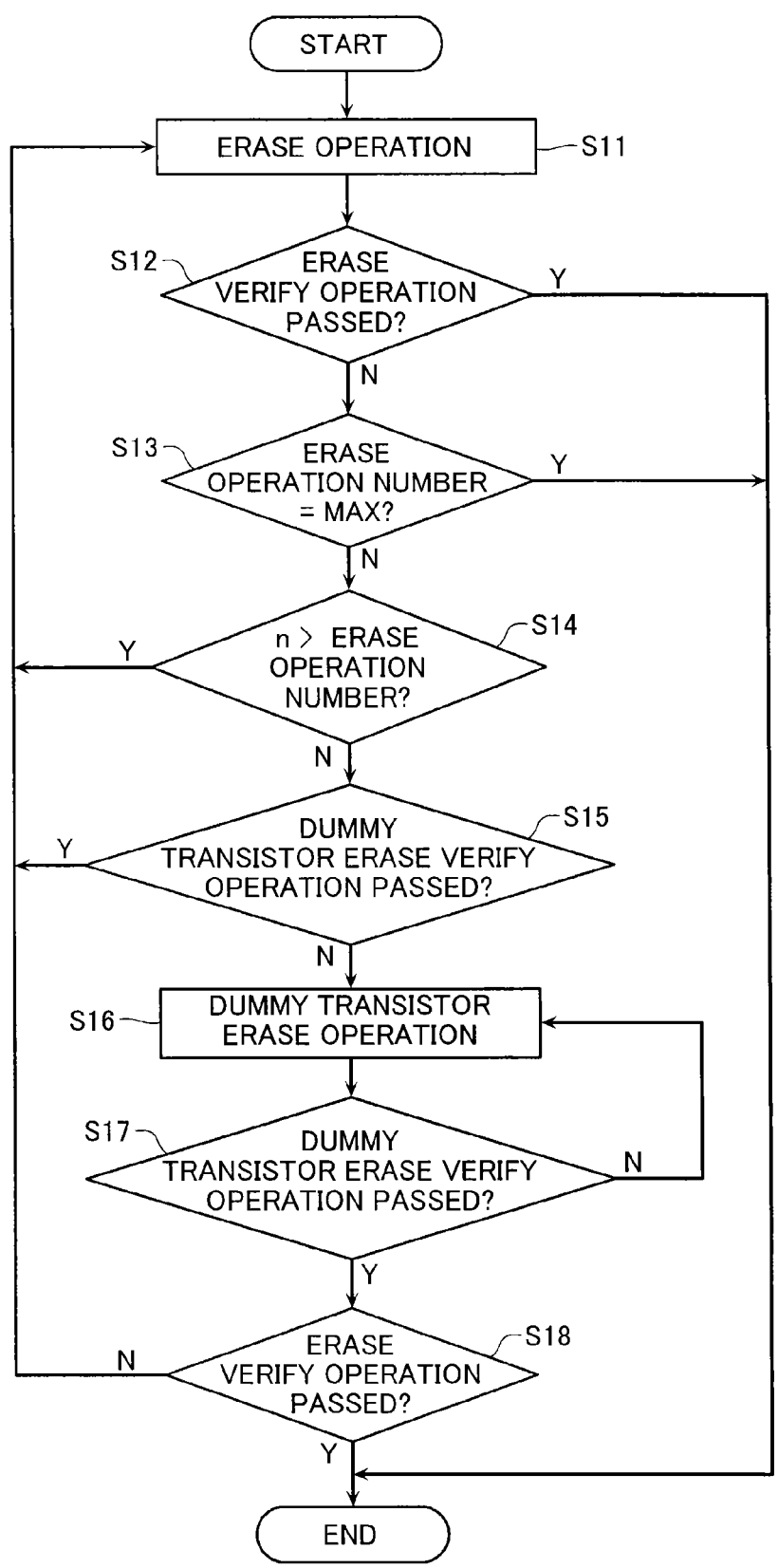
FIG. 10 is a flowchart of an erase sequence of the nonvolatile semiconductor memory device according to the first embodiment.

FIG. 10 shows the flow of the erase sequence in this embodiment.

First, in step S11, an erase operation of changing the threshold voltage of the memory cells MC to the erased state is performed. The erase operation is an operation similar to the erase operation described with reference to FIG. 6, and thus its description is omitted here.

Next, in step S12, an erase verify operation of confirming that the memory cells MC are in the erased state is performed. The erase verify operation is an operation similar to the erase verify operation described with reference to FIG. 7, and thus its description is omitted here. In step S12, it is confirmed whether the erase verify operation is passed. When it is confirmed that the erase verify operation is passed and the memory cells MC0 to MC63 and the dummy transistors DT0 and DT1 are changed to the erased state, the erase sequence is ended. Meanwhile, when the erase verify operation is unpassed, the erase sequence moves to step S13.

In step S13, the number of erase operations performed in one erase sequence is confirmed. When the number of erase operations reaches the acceptable maximum value in one erase sequence, it is determined that further erase sequence may not allow the erase verify operation to be passed, and the erase sequence is ended. In this case, the block BLK subject to the erase operation is stored as the block to which the erase operation is not performed correctly, and is excluded from the subjects for the subsequent write/erase operations.

When the number of erase operations does not reach the acceptable maximum value in one erase sequence, it is confirmed at the next step S14 whether the number of erase operations is less than a predetermined number n. As described above, as the number of write/erase operations increases, the number of loops for which the erase operation is repeated in the erase sequence increases rapidly due to the degradation of the dummy transistors DT. In the erase sequence according to this embodiment, it is determined, on the basis of the number of erase operations in the erase sequence, whether the dummy transistors DT are degraded.

Figure 11:
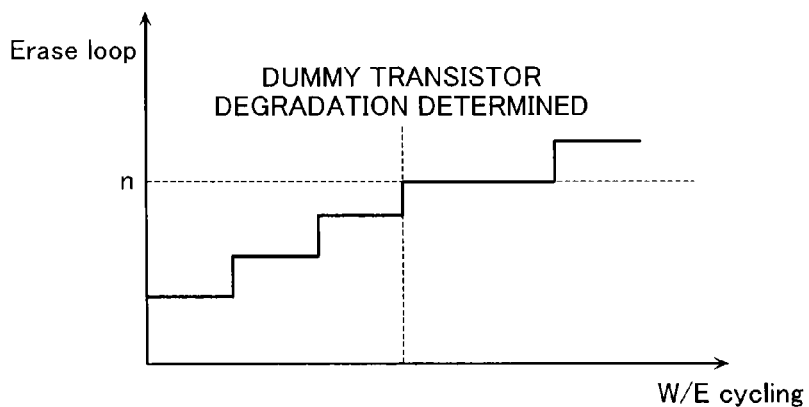
FIG. 11 shows the condition for determining the implementation of a dummy transistor erase operation of the nonvolatile semiconductor memory device according to the first embodiment.

FIG. 11 shows the number of times the erase operation is repeated in the erase sequence according to this embodiment. With reference to FIG. 11, as the number of write/erase operations increases, the number of erase loops increases. The predetermined value n of the number of erase loops is set to a value that is reached when the number of write/erase operations increases and the dummy transistors DT are degraded. Specifically, when the number of erase loops is equal to or more than the predetermined value n, the dummy transistors DT are degraded and are not changed to the erased state, so that it is determined that the number of erase loops is increased.

In step S14, when the number of loops is less than the predetermined number n, it is determined that the erase verify operation is unpassed because the memory cells MC are not changed to the erased state, and the erase operation in step S11 is performed again.

Meanwhile, in step S14, when the number of loops is equal to or more than the predetermined number n, it is determined that the erase verify operation is unpassed because the dummy transistors DT are not changed to the erased state. When the number of erase loops for which the erase operation is repeated in the erase sequence is equal to or more than the predetermined value n, the erase sequence moves to step S15 and performs the operations as described below.

In step S15, a dummy transistor erase verify operation of confirming whether the dummy transistors DT are in the erased state is performed. Thus, it is determined whether the erase verify operation is unpassed because the dummy transistors DT are actually not changed to the erased state.

Figure 12:
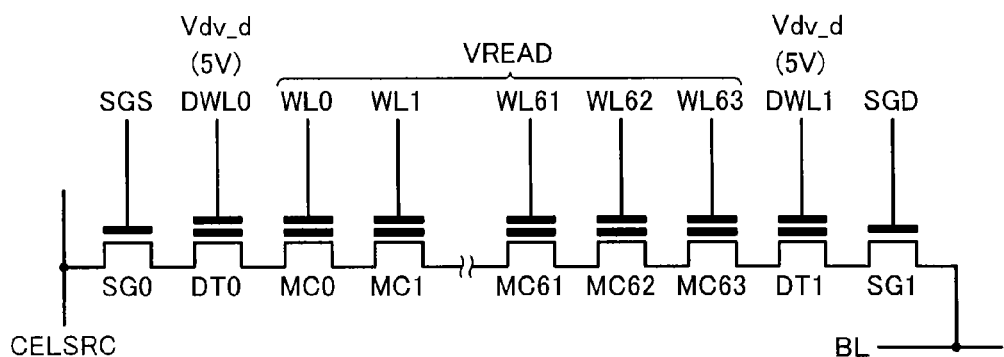
FIG. 12 illustrates applied voltages in the dummy transistor erase verify operation of the nonvolatile semiconductor memory device according to the first embodiment.

FIG. 12 shows the voltage application condition of the memory cell array 1 in the dummy transistor erase verify operation of this embodiment. In the dummy transistor erase verify operation, the sequence control circuit 7 controls the voltage generation circuit 8 to apply the voltage VREAD to all word lines WL. The voltage VREAD ensures that the memory cells MC are rendered conductive. In addition, the dummy word lines DWL0 and DWL1 are applied with a dummy word line read pass voltage Vdv_d (5 V in FIG. 12). Then, the select gate lines SGS and SGD are turned on and the common source line CELSRC is applied with a positive voltage. The sense amplifier circuit S/A then detects the charge state of the bit lines BL. The charge state is based on current flowing from the common source line CELSRC side to the NAND strings 4. The sense amplifier circuit S/A thus confirms whether the dummy transistors DT0 and DT1 are changed to the threshold voltage distribution of the erased state. Here, because, as the dummy word line read pass voltage Vdv_d, a voltage is applied that is the same as the dummy word line read pass voltage Vv_d in the erase verify operation, it is easy to control the voltages of the dummy word lines DWL0 and DWL1 in the dummy transistor erase verify operation. Note that after the bit lines BL are charged, the voltages are set to the condition as shown in FIG. 12, and the discharge state of the bit lines BL based on current flowing from the bit lines BL side to the NAND strings 4 may be detected to perform the dummy transistor erase verify operation.

In step S15, it is confirmed whether the dummy transistor erase verify operation is passed. When the dummy transistor erase verify operation is passed, it is determined that the erase verify operation in step S12 is unpassed because the memory cells MC are not changed to the erased state, and the erase operation in step S11 is performed again. Meanwhile, when the dummy transistor erase verify operation is unpassed, it is determined that the erase verify operation in step S12 is unpassed because the dummy transistors DT are not changed to the erased state, and the erase sequence moves to step S16.

Next, in step S16, a dummy transistor erase operation of selectively changing the threshold voltage of the dummy transistors DT, among the memory cells MC and the dummy transistors DT, to the erased state is performed.

Figure 13:
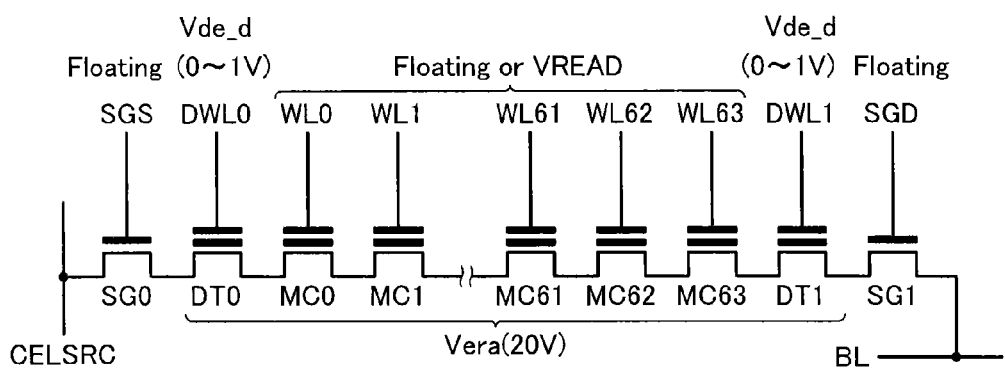
FIG. 13 illustrates applied voltages in the dummy transistor erase operation of the nonvolatile semiconductor memory device according to the first embodiment.

FIG. 13 shows the voltage application condition of the memory cell array 1 in the dummy transistor erase operation in this embodiment. In the dummy transistor erase operation, the sequence control circuit 7 controls the voltage generation circuit 8 to apply an erase voltage Vera (about 10 to 30 V, 20 V in FIG. 13) to the well in which the NAND strings 4 of the selected block BLK are formed. In addition, the sequence control circuit 7 controls the voltage generation circuit 8 to apply the voltage VREAD via the row decoder/word line driver 2a to all word lines WL in the selected block BLK. Alternatively, all word lines WL in the selected block BLK may be set to the floating state. In addition, in this embodiment, the dummy word lines DWL0 and DWL1 are applied with a voltage Vde_d (0 V to 1 V in FIG. 13), which is lower than the voltage VREAD applied to the word lines WL. The sequence control circuit 7 may also arbitrarily change the value of the voltage Vde_d. Then, the select gate lines SGS and SGD are set to the floating state. Thus, electrons accumulated in the charge accumulation layers of the dummy transistors DT0 and DT1 are discharged to the well side by the FN tunnel current. Note that for a charge trap type charge accumulation layer, holes are injected from the well side.

As described in this embodiment, the word lines WL may be set to a state in which the voltage VREAD is applied or to the floating state to reduce the stress applied to the memory cells MC0 to MC63 in the dummy transistor erase operation.

Next, in step S17, the dummy transistor erase verify operation of confirming that the dummy transistors DT are in the erased state is performed. The dummy transistor erase verify operation is an operation similar to the dummy transistor erase verify operation described with reference to FIG. 12 and thus its description is omitted here.

In step S17, it is confirmed whether the dummy transistor erase verify operation is passed. When the dummy transistor erase verify operation is passed, then it is determined that the dummy transistors DT are changed to the erased state, and the erase sequence moves to the next step S18. Meanwhile, when the dummy transistor erase verify operation is unpassed, the dummy transistor erase operation in step S16 is performed again.

Next, in step S18, the erase verify operation is performed. The erase verify operation is an operation similar to the erase verify operation in step S12, and thus its description is omitted here. In step S18, it is confirmed whether the erase verify operation is passed. When the erase verify operation is passed, then it is determined that both of the memory cells MC and the dummy transistors DT are changed to the erased state, and the erase sequence is ended. Meanwhile, when the erase verify operation is unpassed, then it is determined that the dummy transistors DT are changed to the erased state but the memory cells MC are not changed to the erased state, and the erase sequence moves to step S11.

[Effects]

According to the erase sequence of this embodiment, it is determined, on the basis of the dummy transistor erase verify operation in step S15, whether the erase verify operation in step S12 is unpassed because the memory cells MC are not changed to the erased state or the dummy transistors DT are not changed to the erased state. When it is determined that the reason is that the dummy transistors DT are not changed to the erased state, then the dummy transistor erase sequence in steps S16 and S17 is performed. Specifically, in order to selectively change the dummy transistors DT that cause the erase verify operation to be unpassed to the erased state, the dummy transistor erase operation is performed.

Figure 14:
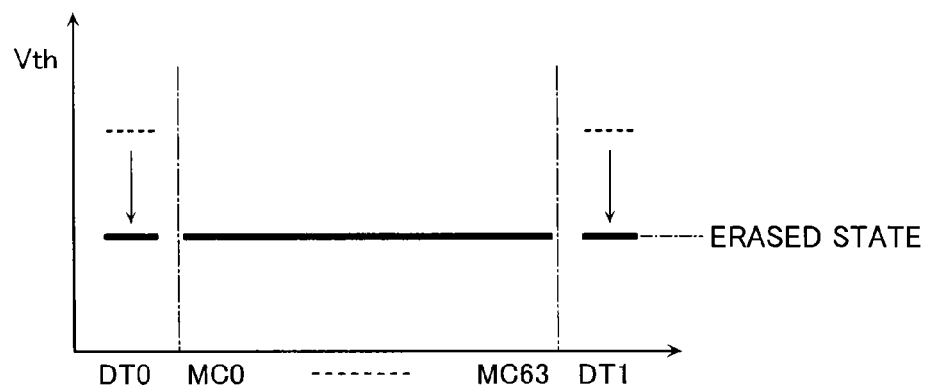
FIG. 14 illustrates the threshold voltage of the erase sequence of the nonvolatile semiconductor memory device according to the first embodiment.

FIG. 14 shows the threshold voltages of the memory cells MC0 to MC63 and the dummy transistors DT0 and DT1 in the erase sequence according to this embodiment. Even when the dummy transistors DT0 and DT1 are degraded and it is hard for them to change to the erased state, the dummy transistor erase operation decreases the threshold voltage of the dummy transistors DT0 and DT1. Then, it is controlled that the memory cells MC0 to MC63 do not experience the stress by the erase voltage Vera. As a result, as shown in FIG. 14, the threshold voltage of only the dummy transistors DT0 and DT1 may be decreased and the over-erased state of the memory cells MC0 to MC63 may be prevented. Note that the threshold voltage of the dummy transistors DT0 and DT1 may not be reduced to a level similar to that of the memory cells MC0 to MC63. The threshold voltage may only be changed to an erased state in which the application of the dummy word line read pass voltage Vv_d to the dummy word lines DWL0 and DWL1 may render conductive the dummy transistors DT0 and DT1.

Figure 15:
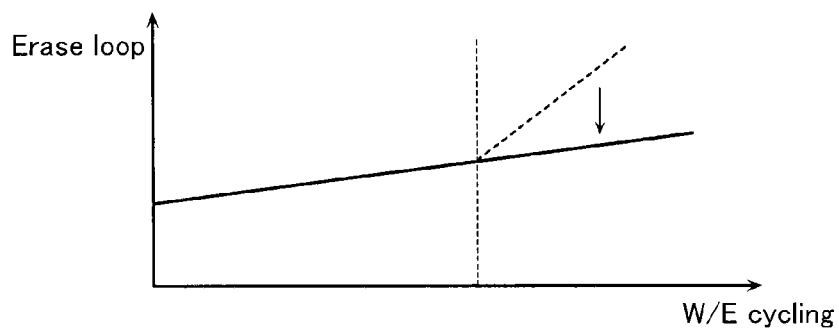
FIG. 15 shows the number of erase operation loops in the erase sequence of the nonvolatile semiconductor memory device according to the first embodiment.

FIG. 15 shows the number of times the erase operation is repeated in the erase sequence according to this embodiment. With reference to FIG. 15, when the number of write/erase operations is low, the number of loops for which the erase operation is repeated in the erase sequence increases slowly due to the degradation of the memory cells MC. In addition, even when the number of write/erase operations increases and thus the dummy transistors DT are degraded, the dummy transistor erase operation of decreasing the threshold voltage of the dummy transistors DT is performed, which may reduce the increase of the number of erase loops. The number of erase loops is the number of erase operations to the memory cells MC.

In this way, the dummy transistor erase operation and the dummy transistor erase verify operation may be performed to reduce the increase of the number of erase operations to the memory cells MC0 to MC63. As a result, the degradation of the memory cells MC0 to MC63 may be reduced and the reliability of data held in the memory cells MC0 to MC63 may be improved.

The nonvolatile semiconductor memory device of this embodiment may reduce the degradation of the memory cells MC0 to MC63 as well as correctly perform the erase operation and the erase verify operation.

Second Embodiment

Figure 16:
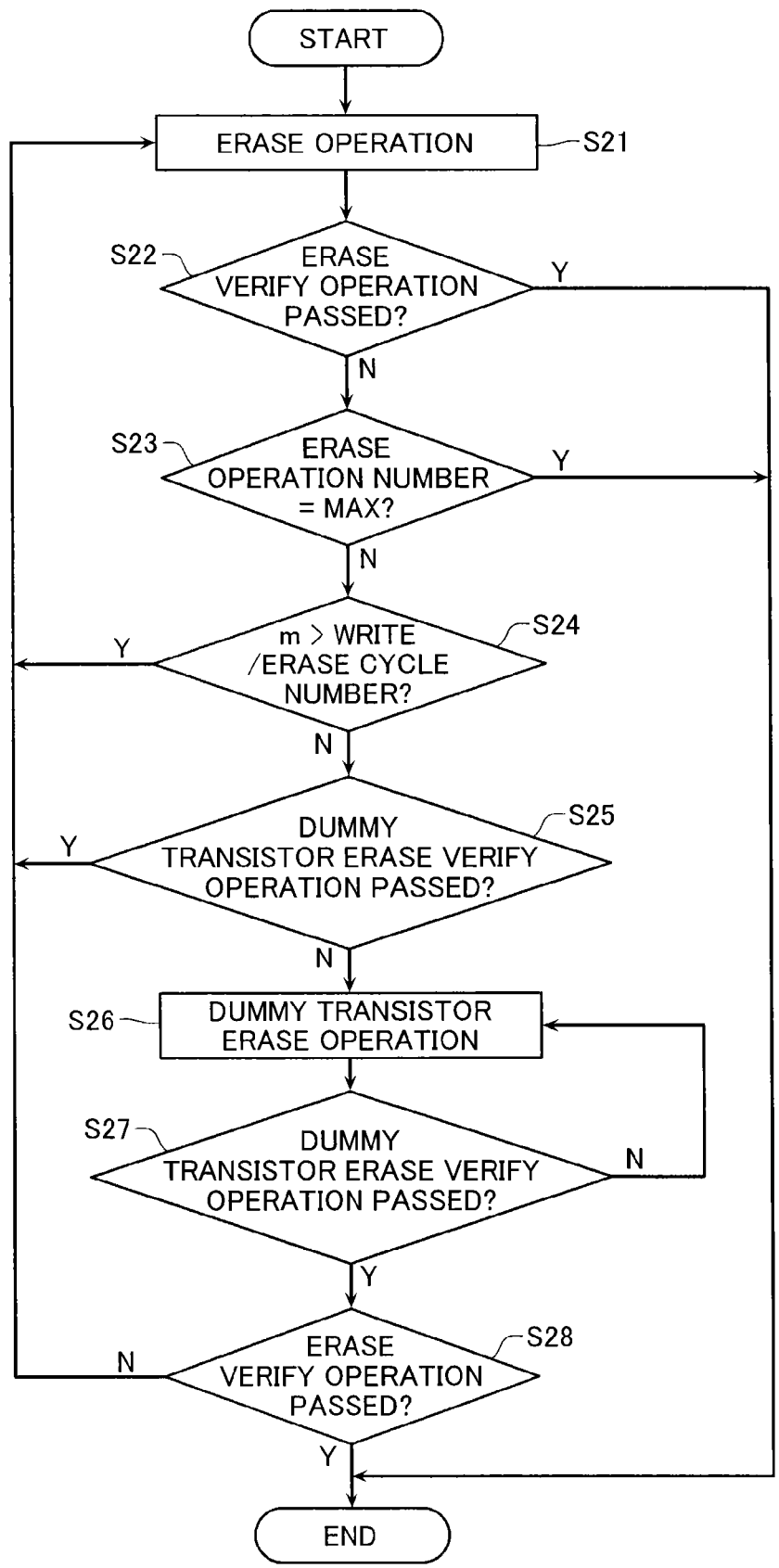
FIG. 16 shows a flowchart of an erase sequence of a nonvolatile semiconductor memory device according to a second embodiment.
Figure 17:
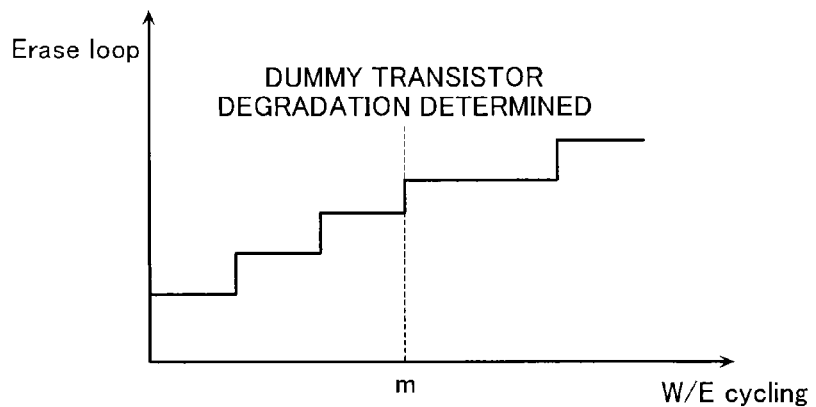
FIG. 17 shows the condition for determining the implementation of a dummy transistor erase operation of the nonvolatile semiconductor memory device according to the second embodiment.

With reference now to FIGS. 16 and 17, a second embodiment of the present invention will be described. The entire configuration of the nonvolatile semiconductor memory device in the second embodiment is similar to that in the first embodiment, and thus its detailed description is omitted here. In addition, like elements as those in the first embodiment are designated by like reference numerals, and repeated description thereof is omitted here.

In the first embodiment, the determination whether the dummy transistors DT are degraded is based on the number of erase loops. The erase sequence in this embodiment determines whether the dummy transistors DT are degraded, on the basis of the number of write/erase operations to the memory cell array 1, unlike the first embodiment. With reference to FIGS. 16 and 17, the erase sequence of the nonvolatile semiconductor memory device according to this embodiment will be described below.

[Erase Sequence According to Second Embodiment]

FIG. 16 shows a flow of the erase sequence in this embodiment. In the erase sequence in FIG. 16, step S21 to step S23 and step S25 to step S28 are similar to step S11 to step S13 and step S15 to step S18, respectively, in the erase sequence in the first embodiment shown in FIG. 10, and thus their description is omitted here.

In the erase sequence according to this embodiment, in step S24, it is determined whether the number of write/erase operations is less than a predetermined number m. As described above, as the number of write/erase operations increases, the number of loops for which the erase operation is repeated in the erase sequence increases rapidly due to the degradation of the dummy transistors DT. The erase sequence according to this embodiment determines, on the basis of the number of write/erase operations to the memory cell array 1, whether the dummy transistors DT are degraded.

FIG. 17 shows the number of times the erase operation is repeated in the erase sequence according to this embodiment. With reference to FIG. 17, as the number of write/erase operations increases, the number of erase loops increases. The predetermined value m of the number of write/erase operations is set to a value at which the dummy transistors DT are degraded. Specifically, when the number of write/erase operations is equal to or more than the predetermined value m, then it is determined that the dummy transistors DT are degraded and are not changed to the erased state.

In step S24, when the number of write/erase operations is less than the predetermined number m, it is determined that the erase verify operation is unpassed because the memory cells MC are not changed to the erased state, and the erase operation in step S21 is performed again.

Meanwhile, in step S24, when the number of write/erase operations is equal to or more than the predetermined number m, it is determined that the erase verify operation is unpassed because the dummy transistors DT are not changed to the erased state. When the number of write/erase operations is equal to or more than the predetermined value m, then the erase sequence moves to step S25 and performs the dummy transistor erase operation and the dummy transistor erase verify operation.

[Effects]

Also in the erase sequence according to this embodiment, the dummy transistor erase operation and the dummy transistor erase verify operation may be performed to reduce the increase of the number of erase operations to the memory cells MC0 to MC63. As a result, the degradation of the memory cells MC0 to MC63 may be reduced and the reliability of data held in the memory cells MC0 to MC63 may be improved.

The nonvolatile semiconductor memory device of this embodiment may reduce the degradation of the memory cells MC0 to MC63 as well as correctly perform the erase operation and the erase verify operation.

Note that the number of write/erase operations may be configured to be held by the sequence control circuit 7 of the NAND chip 10 or by the external controller 11. In addition, as the number of write/erase operations, values for each of the blocks BLK subject to the erase sequence in the memory cell array 1 may be used. Alternatively, considering that generally in the NAND flash memory, a wear leveling process is performed to reduce the variation of the number of write/erase operations for each block BLK, a common value averaged over all blocks BLK0 to BLKn in the memory cell array 1 may be used. The number of write/erase operations to the memory cell array 1 reflects the degraded state of the memory cells MC and the dummy transistors DT more accurately. The number of write/erase operations may be used to control the dummy transistor erase operation and the dummy transistor erase verify operation, thus allowing the erase sequence reflects more reliably the degraded state of the memory cells MC and the dummy transistors DT.

Third Embodiment

Figure 18:
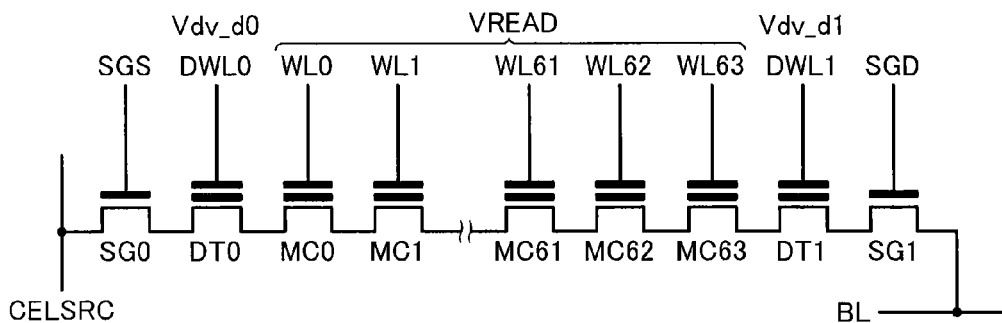
FIG. 18 illustrates applied voltages in a dummy transistor erase verify operation of a nonvolatile semiconductor memory device according to a third embodiment.
Figure 19:
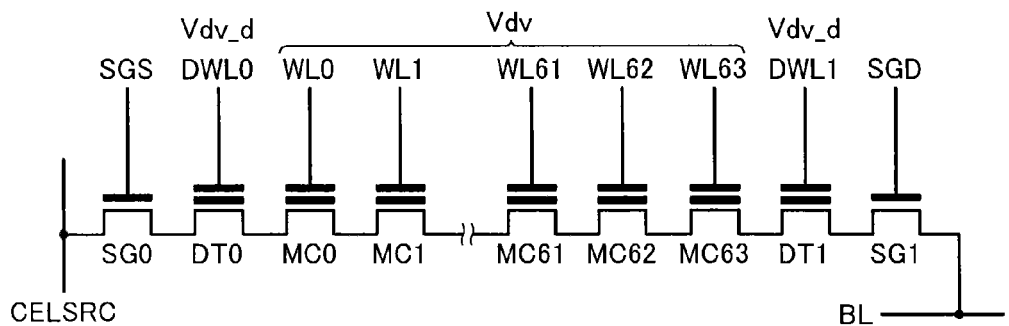
FIG. 19 illustrates applied voltages in the dummy transistor erase verify operation of the nonvolatile semiconductor memory device according to the third embodiment.

With reference now to FIGS. 18 and 19, a third embodiment of the present invention will be described. The entire configuration of the nonvolatile semiconductor memory device in the third embodiment is similar to that in the first embodiment, and thus its detailed description is omitted here. In addition, like elements as those in the first embodiment are designated by like reference numerals, and repeated description thereof is omitted here.

In this embodiment, the control of the applied voltage in the dummy transistor erase verify operation is different from those in the above embodiments. With reference to FIGS. 18 and 19, a dummy transistor erase verify operation of the nonvolatile semiconductor memory device according to this embodiment will be described below. Note that the dummy transistor erase verify operation according to this embodiment may be applied to any erase sequences in the above embodiments.

[Dummy Transistor Erase Verify Operation according to Third Embodiment]

FIG. 18 shows the voltage application condition of the memory cell array 1 in the dummy transistor erase verify operation in this embodiment. In the dummy transistor erase verify operation, the dummy word lines DWL0 and DWL1 are applied with dummy word line read pass voltages Vdv_d0 and Vdv_d1, respectively. The sense amplifier circuit S/A then detects the charge state or discharge state of the bit lines BL based on current flowing to the NAND strings 4 and thus confirms whether the dummy transistors DT0 and DT1 are changed to the threshold voltage distribution of the erased state.

The sequence control circuit 7 may separately control the dummy word line read pass voltages Vdv_d0 and Vdv_d1. In addition, the sequence control circuit 7 may also arbitrarily set the values of the dummy word line read pass voltages Vdv_d0 and Vdv_d1. Thus, the dummy transistor erase verify operation may be controlled finely.

FIG. 19 also shows the voltage application condition of the memory cell array 1 in the dummy transistor erase verify operation in this embodiment. In the dummy transistor erase verify operation, the word lines WL0 to WL63 are applied with the word line read pass voltage Vdv. In addition, the dummy word lines DWL0 and DWL1 are applied with the dummy word line read pass voltage Vdv_d. The sense amplifier circuit S/A then detects the charge state or discharge state of the bit lines BL based on current flowing to the NAND strings 4 and thus confirms whether the dummy transistors DT0 and DT1 are changed to the threshold voltage distribution of the erased state.

The sequence control circuit 7 may arbitrarily set the value of the word line read pass voltage Vdv. Thus, in the dummy transistor erase verify operation, the stress applied to the memory cells MC0 to MC63 may be reduced.

[Effects]

Also in the erase sequence according to this embodiment, the dummy transistor erase operation and the dummy transistor erase verify operation may be performed to reduce the increase of the number of erase operations to the memory cells MC0 to MC63. As a result, the degradation of the memory cells MC0 to MC63 may be reduced and the reliability of data held in the memory cells MC0 to MC63 may be improved. The nonvolatile semiconductor memory device of this embodiment may reduce the degradation of the memory cells MC0 to MC63 as well as correctly perform the erase operation and the erase verify operation.

In addition, according to the nonvolatile semiconductor memory device of this embodiment, the dummy transistor erase verify operation may be controlled more finely.

Fourth Embodiment

Figure 20:
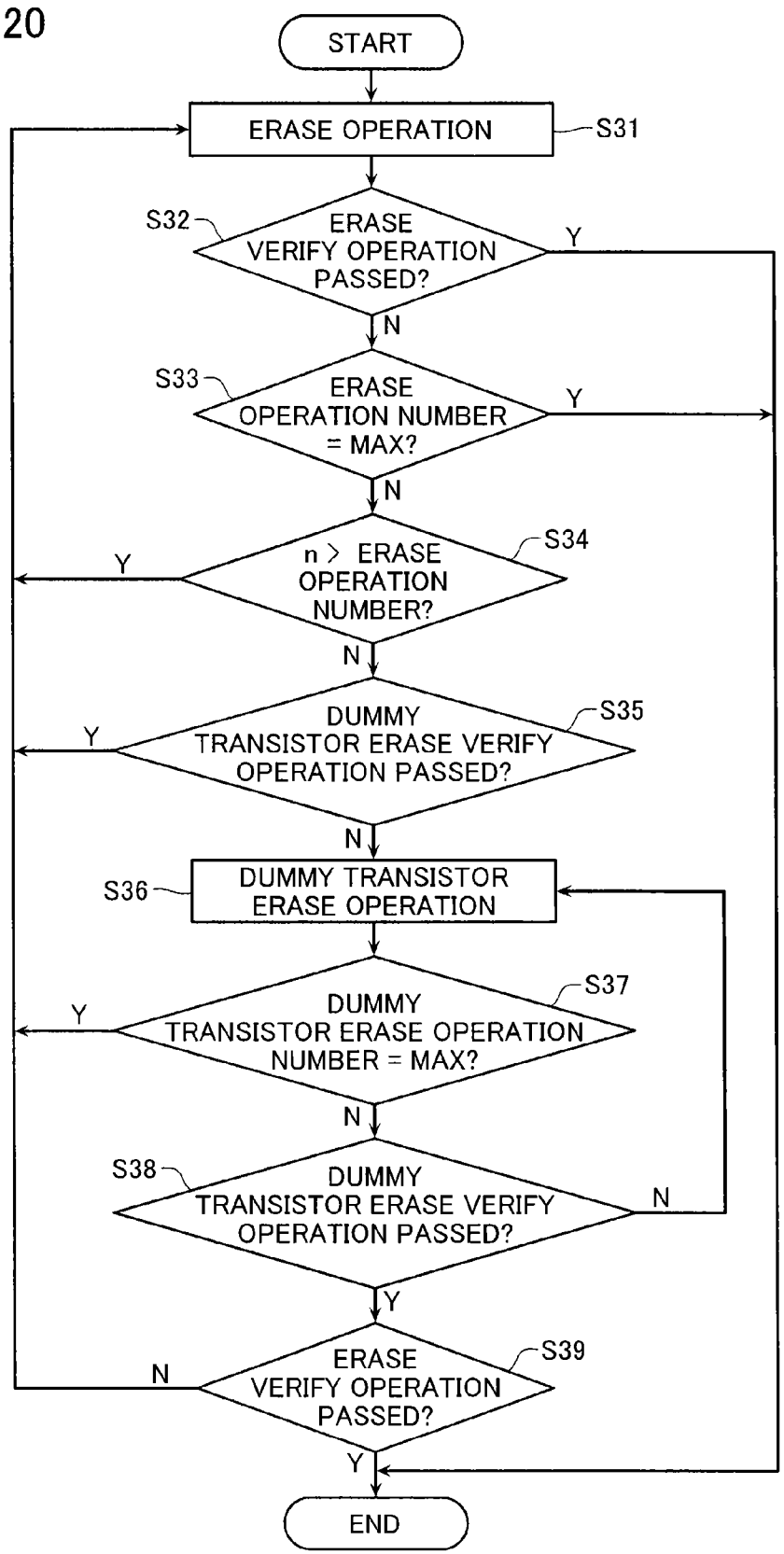
FIG. 20 shows a flowchart of an erase sequence of a nonvolatile semiconductor memory device according to a fourth embodiment.

With reference now to FIG. 20, a fourth embodiment of the present invention will be described. The entire configuration of the nonvolatile semiconductor memory device in the fourth embodiment is similar to that in the first embodiment, and thus its detailed description is omitted here. In addition, like elements as those in the first embodiment are designated by like reference numerals, and repeated description thereof is omitted here.

In the above embodiments, the dummy transistor erase operation and the dummy transistor erase verify operation are repeated until the dummy transistors DT change to the erased state. In this embodiment, the erase sequence ends the dummy transistor erase operation when the number of dummy transistor erase operations reaches the predetermined value, unlike the above embodiments. With reference to FIG. 20, the erase sequence of the nonvolatile semiconductor memory device according to this embodiment will be described below.

[Erase Sequence According to Fourth Embodiment]

FIG. 20 shows a flow of the erase sequence in this embodiment. In the erase sequence in FIG. 20, step S31 to step S36 and step S38 to step S39 are similar to step S11 to step S16 and step S17 to step S18, respectively, in the erase sequence in the first embodiment shown in FIG. 10, and thus their description is omitted here.

In the erase sequence according to this embodiment, in step S37, the number of dummy transistor erase operations is confirmed. When the number of dummy transistor erase operations reaches the acceptable maximum value in the dummy transistor erase sequence in step S36 and step S38, it is determined that further dummy transistor erase operation may apply excessive stress to the dummy transistors DT, and the dummy transistor erase operation is ended. In this case, the erase operation in step S31 and the erase verify operation in step S32 are performed again.

[Effects]

Also in the erase sequence according to this embodiment, the dummy transistor erase operation and the dummy transistor erase verify operation may be performed to reduce the increase of the number of erase operations to the memory cells MC0 to MC63. As a result, the degradation of the memory cells MC0 to MC63 may be reduced and the reliability of data held in the memory cells MC0 to MC63 may be improved. The nonvolatile semiconductor memory device of this embodiment may reduce the degradation of the memory cells MC0 to MC63 as well as correctly perform the erase operation and the erase verify operation.

In addition, according to the erase sequence of this embodiment, it may be prevented that a large number of dummy transistor erase operations and dummy transistor erase verify operations are repeated, thus degrading the dummy transistors DT.

Fifth Embodiment

Figure 21:
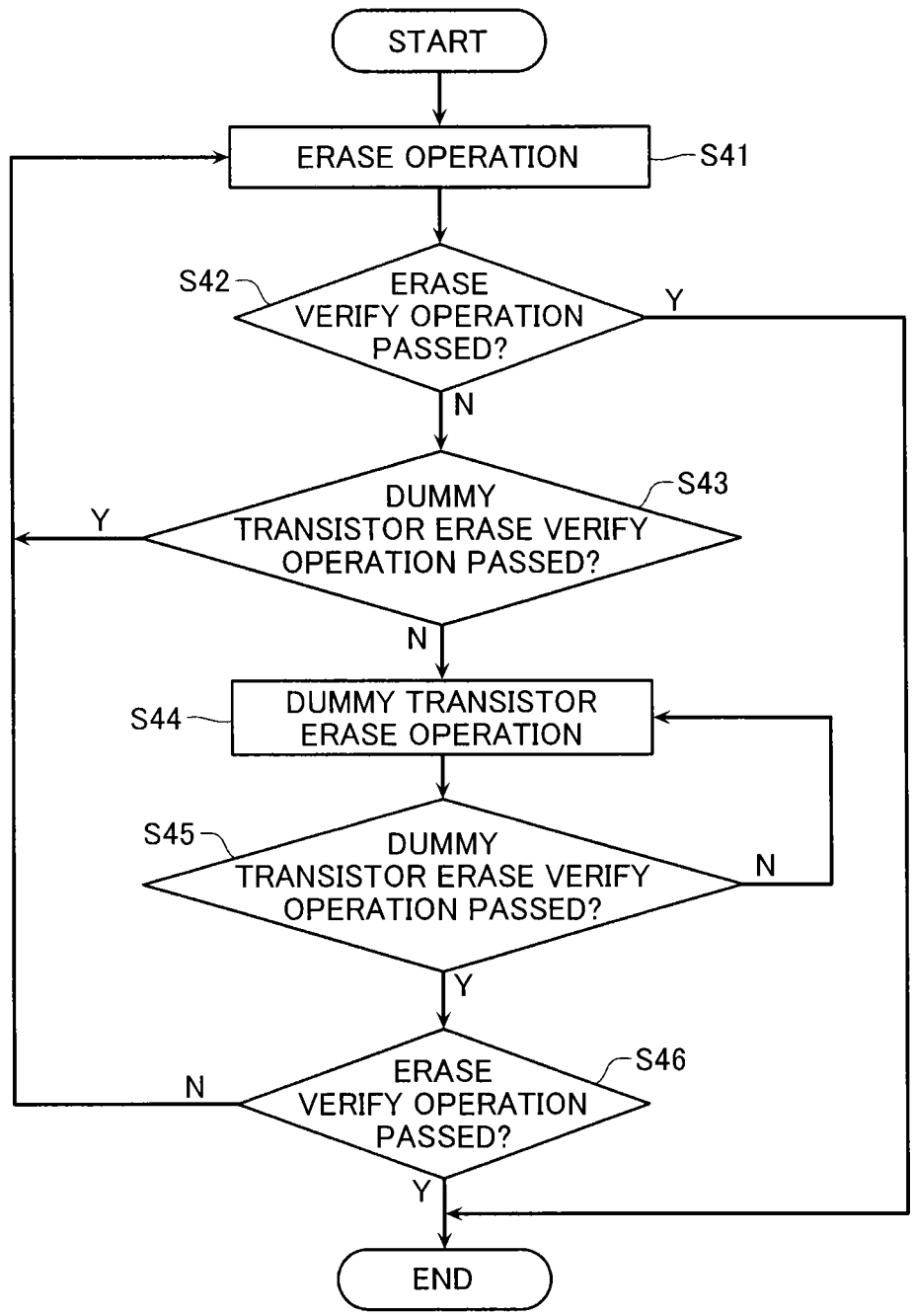
FIG. 21 shows a flowchart of an erase sequence of a nonvolatile semiconductor memory device according to a fifth embodiment.

With reference now to FIG. 21, a fifth embodiment of the present invention will be described. The entire configuration of the nonvolatile semiconductor memory device in the fifth embodiment is similar to that in the first embodiment, and thus its detailed description is omitted here. In addition, like elements as those in the first embodiment are designated by like reference numerals, and repeated description thereof is omitted here.

In the above embodiment, the dummy transistor erase operation is performed when the number of erase operations or the number of write/erase cycles is equal to or more than a predetermined value. In this embodiment, the erase sequence performs, regardless of the number of erase operations or the number of write/erase cycles, the dummy transistor erase operation when the dummy transistor erase verify operation is unpassed, unlike the above embodiments. With reference to FIG. 21, the erase sequence of the nonvolatile semiconductor memory device according to this embodiment will be described below.

[Erase Sequence According to Fifth Embodiment]

FIG. 21 shows a flow of the erase sequence in this embodiment. In the erase sequence in FIG. 21, step S41 to step S42 are similar to step S11 to step S12 in the erase sequence in the first embodiment shown in FIG. 10. In addition, in the erase sequence in FIG. 21, step S43 to step S46 are similar to step S15 to step S18 in the erase sequence in the first embodiment shown in FIG. 10.

The erase sequence according to this embodiment performs, if in step S42 the erase verify operation is unpassed, the dummy transistor erase verify operation in step S43 without confirming the number of erase operations or the number of write/erase cycles. This omits the operation of determining whether the erase verify operation is unpassed due to the degradation of the dummy transistors DT, and performs the dummy transistor erase operation on the basis of whether the dummy transistors DT are actually changed to the erased state.

[Effects]

Also in the erase sequence according to this embodiment, the dummy transistor erase operation and the dummy transistor erase verify operation may be performed to reduce the increase of the number of erase operations to the memory cells MC0 to MC63. As a result, the degradation of the memory cells MC0 to MC63 may be reduced and the reliability of data held in the memory cells MC0 to MC63 may be improved. The nonvolatile semiconductor memory device of this embodiment may reduce the degradation of the memory cells MC0 to MC63 as well as correctly perform the erase operation and the erase verify operation.

In addition, the erase sequence in this embodiment may omit the operation of confirming the number of erase operations or the number of write/erase cycles and determining whether the erase verify operation is unpassed due to the degradation of the dummy transistors DT. As a result, the amount of time necessary for the erase sequence may be reduced.

Sixth Embodiment

Figure 22:
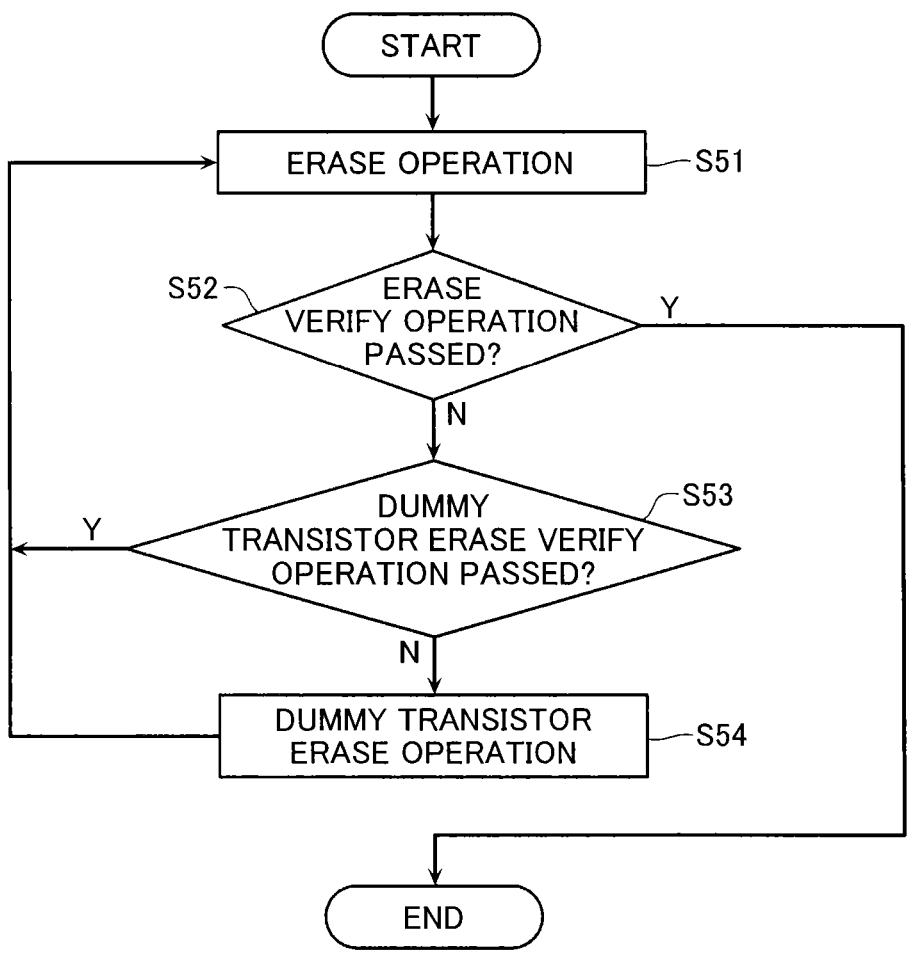
FIG. 22 shows a flowchart of an erase sequence of a nonvolatile semiconductor memory device according to a sixth embodiment.

With reference now to FIG. 22, a sixth embodiment of the present invention will be described. The entire configuration of the nonvolatile semiconductor memory device in the sixth embodiment is similar to that in the first embodiment, and thus its detailed description is omitted here. In addition, like elements as those in the first embodiment are designated by like reference numerals, and repeated description thereof is omitted here.

In the above fifth embodiment, the dummy transistor erase operation is followed by the dummy transistor erase verify operation. In this embodiment, the erase sequence returns, after the dummy transistor erase operation, to the erase operation regardless of the state of the dummy transistors DT, unlike the above fifth embodiment. With reference to FIG. 22, the erase sequence of the nonvolatile semiconductor memory device according to this embodiment will be described below.

[Erase Sequence According to Sixth Embodiment]

FIG. 22 shows a flow of the erase sequence in this embodiment. In the erase sequence in FIG. 22, step S51 to step S54 are similar to step S41 to step S44 in the erase sequence in the fifth embodiment shown in FIG. 21.

The erase sequence according to this embodiment performs, after the dummy transistor erase operation in step S54, the erase operation in step S51 without performing the dummy transistor erase verify operation. The erase sequence according to this embodiment performs, in step S53, when the dummy transistor erase verify operation is unpassed, only one dummy transistor erase operation to the dummy transistors DT and returns to the erase operation in step S51.

[Effects]

Also in the erase sequence according to this embodiment, the dummy transistor erase operation and the dummy transistor erase verify operation may be performed to reduce the increase of the number of erase operations to the memory cells MC0 to MC63. As a result, the degradation of the memory cells MC0 to MC63 may be reduced and the reliability of data held in the memory cells MC0 to MC63 may be improved. The nonvolatile semiconductor memory device of this embodiment may reduce the degradation of the memory cells MC0 to MC63 as well as correctly perform the erase operation and the erase verify operation.

In addition, the erase sequence according to this embodiment may reduce the amount of time taken in the dummy transistor erase operation and the dummy transistor erase verify operation to the dummy transistors DT. As a result, the amount of time necessary for the erase sequence may be reduced.

Seventh Embodiment

Figure 23:
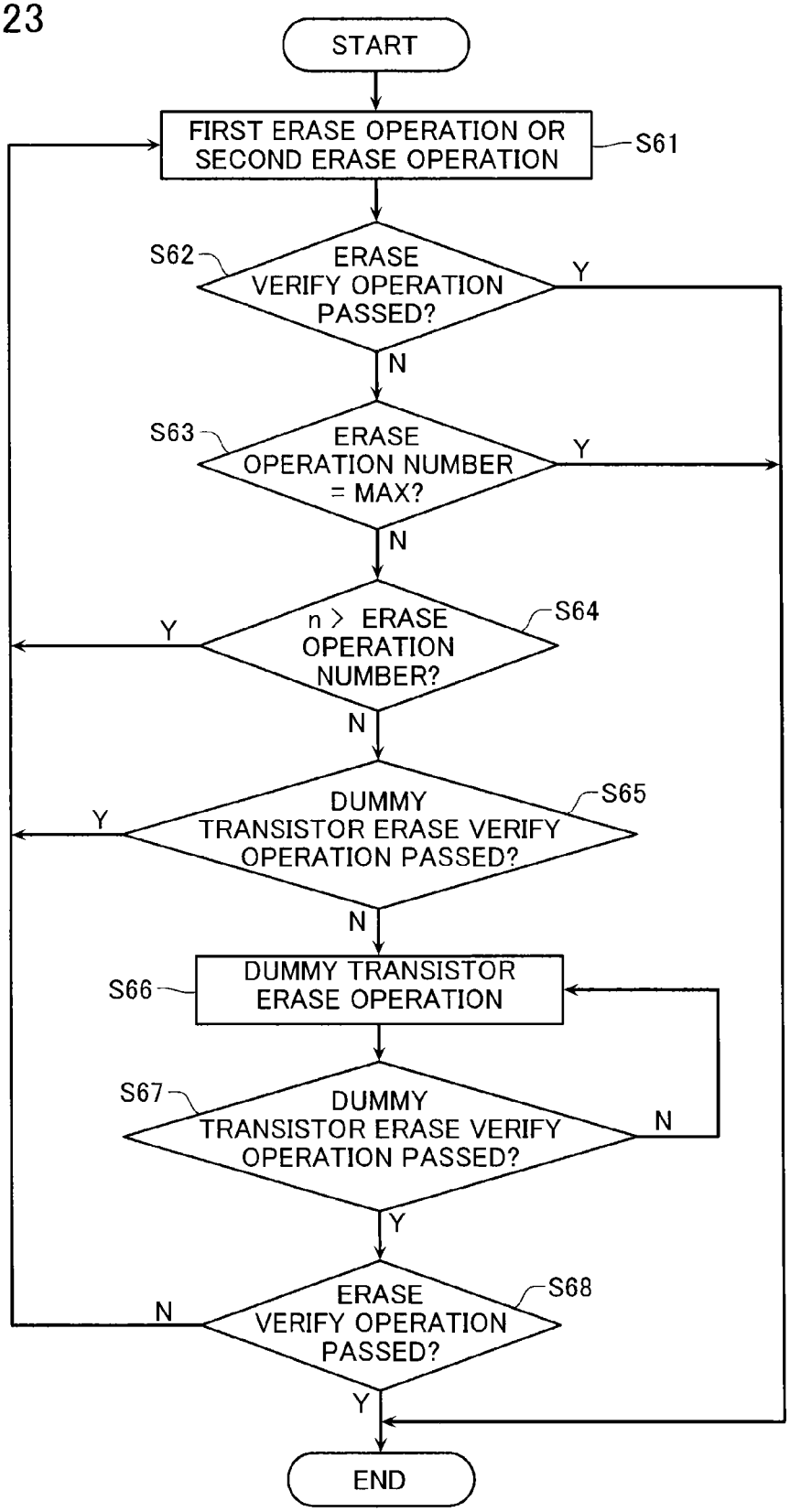
FIG. 23 shows a flowchart of an erase sequence of a nonvolatile semiconductor memory device according to a seventh embodiment.
Figure 24:
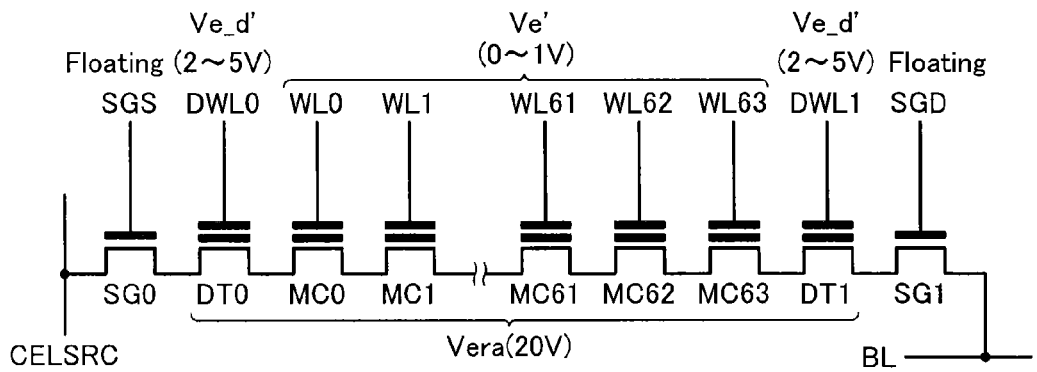
FIG. 24 illustrates applied voltages in an erase operation of the nonvolatile semiconductor memory device according to the seventh embodiment.

With reference now to FIGS. 23 and 24, a seventh embodiment of the present invention will be described. The entire configuration of the nonvolatile semiconductor memory device in the seventh embodiment is similar to that in the first embodiment, and thus its detailed description is omitted here. In addition, like elements as those in the first embodiment are designated by like reference numerals, and repeated description thereof is omitted here.

This embodiment sets the erase operation to different voltage application conditions on the basis of whether the dummy transistor erase verify operation is passed, unlike the above embodiments. With reference to FIGS. 23 and 24, the erase sequence of the nonvolatile semiconductor memory device according to this embodiment will be described below.

[Erase Sequence According to Seventh Embodiment]

FIG. 23 shows a flow of the erase sequence in this embodiment. In the erase sequence in FIG. 23, step S62 to step S68 are similar to step S12 to step S18 in the erase sequence in the first embodiment shown in FIG. 10.

The erase sequence according to this embodiment selects, when performing the erase operation in step S61, one of the two different types of voltage application conditions to perform the erase operation. In the erase sequence according to this embodiment shown in FIG. 23, in step S61, one of the first erase operation and the second erase operation is performed.

The first erase operation in step S61 is an operation similar to the erase operation described with reference to FIG. 6, and thus its description is omitted here.

FIG. 24 shows the voltage application condition of the memory cell array 1 in the second erase operation of this embodiment. The second erase operation is performed in units of the block BLK. In the second erase operation, the sequence control circuit 7 controls the voltage generation circuit 8 to apply an erase voltage Vera (about 10 V to 30 V, 20 V in FIG. 24) to the well in which the memory cells MC are formed. In addition, the sequence control circuit 7 controls the voltage generation circuit 8 to apply a voltage Ve' (0 V to 1 V in FIG. 24) via the row decoder/word line driver 2a to all word lines WL in the selected block BLK. Thus, electrons accumulated in the charge accumulation layer of each memory cell MC are discharged to the well side by the FN tunnel current. Note that for the charge trap type charge accumulation layer, holes are injected from the well side.

In addition, the second erase operation of this embodiment applies, as shown in FIG. 24, a voltage Ve_d' (2 V to 5 V in FIG. 24) to the dummy word lines DWL0 and DWL1. The voltage Ve_d' is higher than the voltage applied to the word lines WL. The voltage Ve_d' is larger than the voltage Ve_d applied to the dummy word lines DWL0 and DWL1 in the first erase operation (Ve_d'>Ve_d). Such a voltage application condition relaxes the stress applied to the dummy transistors DT0 and DT1 in the second erase operation compared to the stress applied in the first erase operation.

In step S61, whether the first erase operation or the second erase operation is performed depends on the states of the dummy transistors DT0 and DT1. In the erase sequence according to this embodiment, when returning from step S65 or S68 to step S61, the dummy transistor erase verify operation is already passed. In this case, further erase operation of the dummy transistors DT0 and DT1 may further degrade the dummy transistors DT0 and DT1. Then, when returning from step S65 or S68 to step S61, the second erase operation is performed to relax the stress to the dummy transistors DT0 and DT1.

Meanwhile, immediately after starting the erase sequence or when returning from step S64 to step S61, it is not possible to determine whether the dummy transistors DT0 and DT1 are changed to the erased state. In this case, the erase operation is also performed to the dummy transistors DT0 and DT1. Specifically, immediately after starting the erase sequence or when returning from step S64 to step S61, the first erase operation is performed to also perform the erase operation to the dummy transistors DT0 and DT1.

[Effects]

Also in the erase sequence according to this embodiment, the dummy transistor erase operation and the dummy transistor erase verify operation may be performed to reduce the increase of the number of erase operations to the memory cells MC0 to MC63. As a result, the degradation of the memory cells MC0 to MC63 may be reduced and the reliability of data held in the memory cells MC0 to MC63 may be improved. The nonvolatile semiconductor memory device of this embodiment may reduce the degradation of the memory cells MC0 to MC63 as well as correctly perform the erase operation and the erase verify operation.

Also, according to the erase sequence in this embodiment, when the dummy transistor erase verify operation is passed, in the erase sequence in which the erase operation is performed subsequently, at least the voltages applied to the dummy word lines DWL0 and DWL1 may be changed to reduce the stress applied to the dummy transistors DT. As a result, the degradation of the dummy transistors DT may be prevented.

Eighth Embodiment

Figure 25:
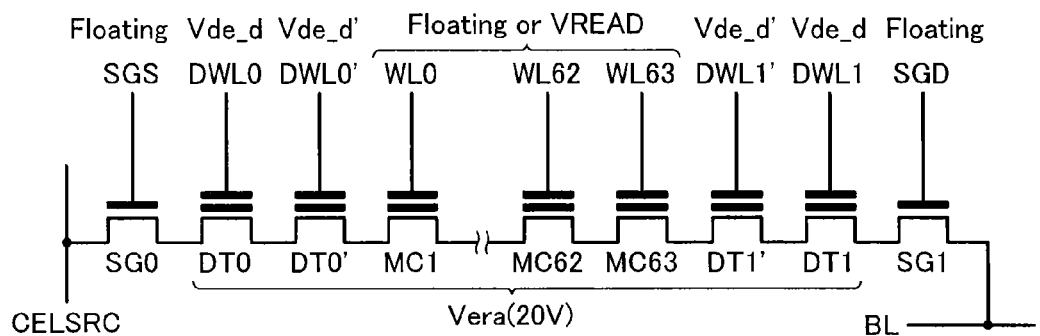
FIG. 25 illustrates applied voltages in a dummy transistor erase operation of a nonvolatile semiconductor memory device according to an eighth embodiment.

With reference now to FIG. 25, an eighth embodiment of the present invention will be described. The entire configuration of the nonvolatile semiconductor memory device in the eighth embodiment is similar to that in the first embodiment, and thus its detailed description is omitted here. In addition, like elements as those in the first embodiment are designated by like reference numerals, and repeated description thereof is omitted here.

In this embodiment, the nonvolatile semiconductor memory device comprises NAND strings 4, each having a first end provided with a plurality of dummy transistors DT and a second end also provided with a plurality of dummy transistors DT, unlike the above embodiments. In this embodiment, the dummy transistor erase operation of the nonvolatile semiconductor memory device thus configured will be described. With reference to FIG. 25, the erase sequence according to this embodiment will be described below.

[Dummy Transistor Erase Operation According to Eighth Embodiment]

FIG. 25 shows the voltage application condition of the memory cell array 1 in the dummy transistor erase operation in this embodiment. With reference to FIG. 25, the memory string including the memory cells MC0 to MC63 has a first end connected to dummy transistors DT0 and DT0' and a second end connected to dummy transistors DT1 and DT1'. The dummy transistors DT0 and DT1 have select gate transistors SG0 and SG1 respectively connected thereto. The dummy transistors DT0' and DT1' have gate electrodes connected to the respective dummy word lines DWL0' and DWL1'.

In the dummy transistor erase operation, the sequence control circuit 7 controls the voltage generation circuit 8 to apply an erase voltage Vera (about 10 to 30 V, 20 V in FIG. 25) to the well in which the NAND strings 4 of the selected block BLK are formed. In addition, the sequence control circuit 7 controls the voltage generation circuit 8 to apply a voltage VREAD via the row decoder/word line driver 2a to all word lines WL in the selected block BLK. Alternatively, all word lines WL in the selected block BLK may be set to the floating state.

In addition, in this embodiment, the dummy word lines DWL0 and DWL1 are applied with a voltage Vde_d and the dummy word lines DWL0' and DWL1' are applied with a voltage Vde_d'. Then, the select gate lines SGS and SGD are set to the floating state. Thus, electrons accumulated in the charge accumulation layers of the dummy transistors DT0 and DT0' and DT1 and DT1' are discharged to the well side by the FN tunnel current. Note that for the charge trap type charge accumulation layer, holes are injected from the well side.

The sequence control circuit 7 may set the value of the voltage Vde_d applied to the dummy word line DWL to a value larger than the voltage Vde_d' (Vde_d>Vde_d'). In addition, the sequence control circuit 7 may also arbitrarily set the values of the voltages Vde_d and Vde_d' applied to the dummy word lines DWL. This may further reduce the stress in the dummy transistor erase operation to the dummy transistors DT0 and DT1 of the dummy transistors DT, the DT0 and DT1 being provided nearest to the select gate transistors SG0 and SG1 and easily degraded, while finely controlling the dummy transistor erase operation.

[Effects]

The configuration of the dummy transistor according to this embodiment may be applied to any of the above embodiments. According to the nonvolatile semiconductor memory device of this embodiment, the number of dummy transistors DT provided in each NAND string 4 may be increased. The memory cells MC adjacent to the select gate transistors SG0 and SG1 are easily degraded and their reliability are easily reduced.

According to the nonvolatile semiconductor memory device of this embodiment, however, the memory cells MC may be distanced from the select gate transistors SG0 and SG1, thus improving the reliability of the memory cells MC.

In addition, according to the dummy transistor erase operation in this embodiment, the dummy transistor erase operation may be controlled more finely.

Ninth Embodiment

Figure 26:
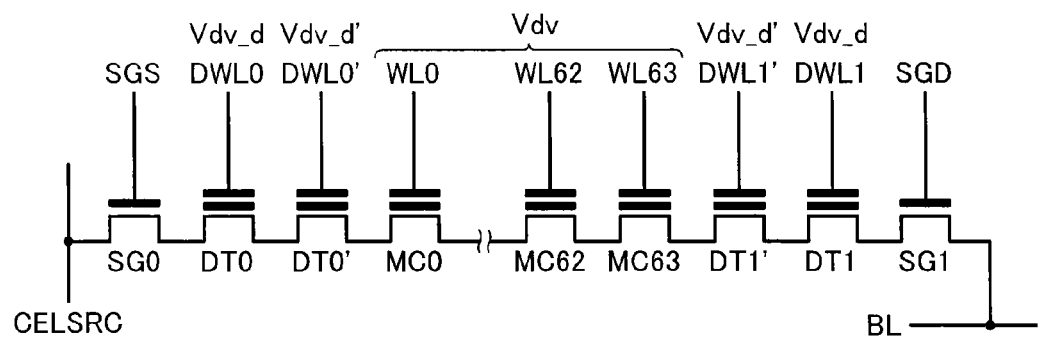
FIG. 26 illustrates applied voltages in a dummy transistor erase verify operation of a nonvolatile semiconductor memory device according to a ninth embodiment.
Figure 27:
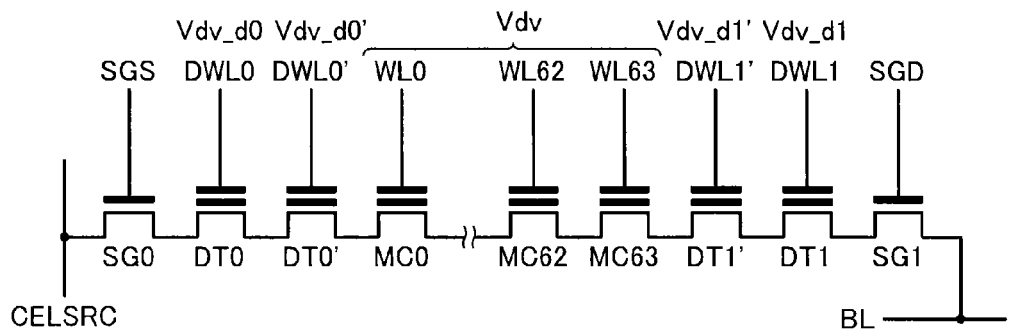
FIG. 27 illustrates applied voltages in the dummy transistor erase verify operation of the nonvolatile semiconductor memory device according to the ninth embodiment.

With reference to FIGS. 26 and 27, a ninth embodiment of the present invention will be described below. The entire configuration of the nonvolatile semiconductor memory device in the ninth embodiment is similar to that in the first embodiment, and thus its detailed description is omitted here. In addition, like elements as those in the first embodiment are designated by like reference numerals, and repeated description thereof is omitted here.

In this embodiment, the nonvolatile semiconductor memory device comprises NAND strings 4, each having a first end provided with a plurality of dummy transistors DT and a second end also provided with a plurality of dummy transistors DT, like the above eighth embodiment. With reference to FIGS. 26 and 27, a nonvolatile semiconductor memory device according to this embodiment and the erase sequence thereof will be described below.

[Nonvolatile Semiconductor Memory Device According to Ninth Embodiment]

FIG. 26 shows the voltage in the dummy transistor erase verify operation of the nonvolatile semiconductor memory device according to the ninth embodiment.

With reference to FIG. 26, the memory string including the memory cells MC0 to MC63 has a first end connected to the dummy transistors DT0 and DT0' and a second end connected to the dummy transistors DT1 and DT1'. The dummy transistors DT0 and DT1 have select gate transistors SG0 and SG1 respectively connected thereto. The dummy transistors DT0' and DT1' have gate electrodes connected to the respective dummy word lines DWL0' and DWL1'.

[Dummy Transistor Erase Verify Operation According to Ninth Embodiment]

FIG. 26 shows the voltage application condition of the memory cell array 1 in the dummy transistor erase verify operation in this embodiment. In the dummy transistor erase verify operation, the word lines WL0 to WL63 are applied with the word line read pass voltage Vdv. In addition, the dummy word lines DWL0 and DWL1 are applied with the dummy word line read pass voltage Vdv_d. Then, the dummy word lines DWL0' and DWL1' are applied with a dummy word line read pass voltage Vdv_d'. The sense amplifier circuit S/A then detects the charge state or discharge state of the bit lines BL based on current flowing to the NAND strings 4, and thus confirms whether the dummy transistors DT0 and DT0' and DT1 and DT1' are changed to the threshold voltage distribution of the erased state.

The sequence control circuit 7 may arbitrarily set the value of the word line read pass voltage Vdv. Thus, in the dummy transistor erase verify operation, the stress applied to the memory cells MC0 to MC63 may be reduced. In addition, the sequence control circuit 7 may set the value of the dummy word line read pass voltage Vdv_d to a value larger than the voltage Vdv_d' (Vdv_d>Vdv_d').

FIG. 27 also shows the voltage application condition of the memory cell array 1 in the dummy transistor erase verify operation in this embodiment. In the dummy transistor erase verify operation, the dummy word lines DWL0 and DWL1 are applied with the dummy word line read pass voltages Vdv_d0 and Vdv_d1, respectively. In addition, the dummy word lines DWL0' and DWL1' are applied with dummy word line read pass voltage Vdv_d0', Vdv_d1', respectively. The sense amplifier circuit S/A then detects the charge state or discharge state of the bit lines BL based on current flowing to the NAND strings 4, and thus confirms whether the dummy transistors DT0 and DT0' and DT1 and DT1' are changed to the threshold voltage distribution of the erased state.

The sequence control circuit 7 may separately control the dummy word line read pass voltages Vdv_d0 and Vdv_d1 and Vdv_d0' and Vdv_d1'. In addition, the sequence control circuit 7 may also arbitrarily set the values of the dummy word line read pass voltages Vdv_d0 and Vdv_d1 and Vdv_d0' and Vdv_d1'. Thus, the dummy transistor erase verify operation may be controlled finely.

[Effects]

The configuration of the dummy transistor according to this embodiment may be applied to any of the above embodiments. According to the nonvolatile semiconductor memory device of this embodiment, the number of dummy transistors DT provided in each NAND string 4 may be increased. The memory cells MC adjacent to the select gate transistors SG0 and SG1 are easily degraded and their reliability is easily reduced. According to the nonvolatile semiconductor memory device of this embodiment, however, the memory cell MCs may be distanced from the select gate transistors SG0 and SG1, thus improving the reliability of the memory cells MC.

In addition, according to the dummy transistor erase verify operation of this embodiment, the dummy transistor erase verify operation may be controlled more finely.

Tenth Embodiment

Figure 28:
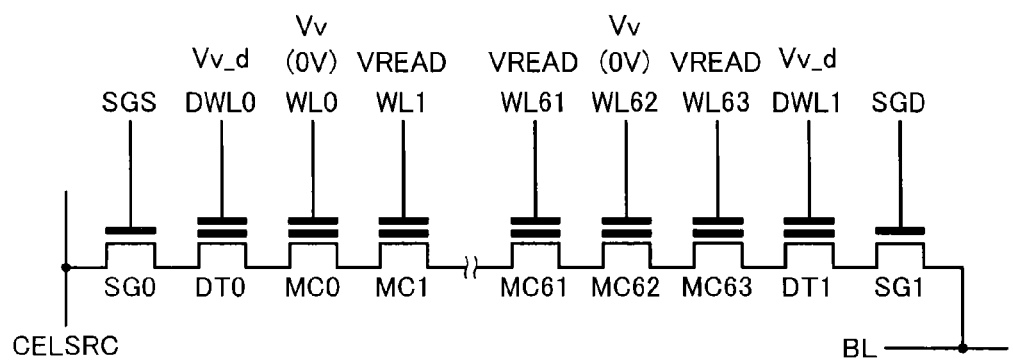
FIG. 28 illustrates applied voltages in an erase verify operation of a nonvolatile semiconductor memory device according to a tenth embodiment.
Figure 29:
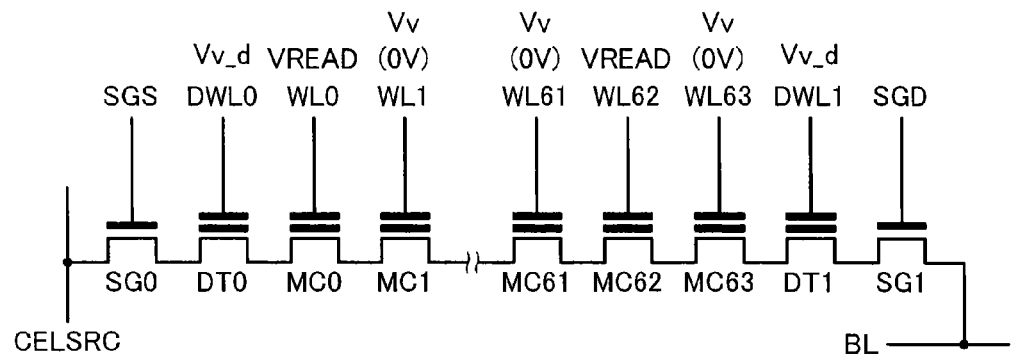
FIG. 29 illustrates applied voltages in the erase verify operation of the nonvolatile semiconductor memory device according to the tenth embodiment.

With reference to FIGS. 28 and 29, a tenth embodiment of the present invention will be described below. The entire configuration of the nonvolatile semiconductor memory device in the tenth embodiment is similar to that in the first embodiment, and thus its detailed description is omitted here. In addition, like elements as those in the first embodiment are designated by like reference numerals, and repeated description thereof is omitted here.

In this embodiment, the nonvolatile semiconductor memory device performs the erase verify operation to the every other memory cell MC, unlike the above embodiments. The erase verify operation confirms whether the memory cells MC are changed to the erased state. With reference to FIGS. 28 and 29, the erase sequence according to this embodiment will be described below.

[Erase Verify Operation According to Tenth Embodiment]

FIGS. 28 and 29 show the voltage application condition of the memory cell array 1 in the erase verify operation in this embodiment. In the erase verify operation, first as shown in FIG. 28, the sequence control circuit 7 controls the voltage generation circuit 8 to apply the word line verify voltage Vv (0 V in FIG. 7) to the even word lines WL0, WL2, ... WL62. The word line verify voltage Vv is higher than the threshold voltage of the erased state of the memory cells MC. In addition, the sequence control circuit 7 controls the voltage generation circuit 8 to apply the read pass voltage VREAD to the odd word lines WL1, WL3, ... WL63. The read pass voltage VREAD is a voltage that renders conductive the memory cells MC. The sense amplifier circuit S/A then detects the charge state of the bit lines BL based on current flowing to the NAND strings 4, and thus confirms whether the even memory cells MC0, MC2, ... MC62 are changed to the threshold voltage distribution of the erased state.

Then, in the erase verify operation, as shown in FIG. 29, the sequence control circuit 7 controls the voltage generation circuit 8 to apply the word line verify voltage Vv (0 V in FIG. 7) to the odd word lines WL1, WL3, ... WL63. The word line verify voltage Vv is higher than the threshold voltage of the erased state of the memory cells MC. In addition, the sequence control circuit 7 controls the voltage generation circuit 8 to apply the read pass voltage VREAD to the even word lines WL0, WL2, ... WL62. The read pass voltage VREAD is a voltage that renders conductive the memory cells MC. The sense amplifier circuit S/A then detects the charge state of the bit lines BL based on current flowing to the NAND strings 4, and thus confirms whether the odd memory cells MC1, MC3, ... MC63 are changed to the threshold voltage distribution of the erased state.

The two erase verify operations shown in FIGS. 28 and 29 may be used to confirm whether the memory cells MC are changed to the erased state.

The dummy word lines DWL0 and DWL1 are applied with the dummy word line read pass voltage Vv_d. The dummy word line read pass voltage Vv_d is large enough to render conductive the dummy word lines DWL0 and DWL1. The sequence control circuit 7 may also arbitrarily set the value of the voltage Vv_d applied to the dummy word line DWL. Thus, the erase verify operation may be controlled finely.

[Effects]

The erase verify operation according to this embodiment may be applied to any of the above embodiments. The erase verify operation of confirming whether the memory cells MC are changed to the erased state may be performed to the every other memory cell MC for more correct erase verify operation.

Some embodiments of the present invention have been described, but these embodiments are shown by way of example and are not intended to limit the scope of the invention. These new embodiments may be implemented in various other forms, and subjected to various omissions, replacements, and modifications without departing from the spirit of the present invention. These embodiments and variants thereof are within the scope and sprit of the invention, and are also within the scope of the invention as defined in the appended claims and the equivalents thereof.

What is claimed is:

1. A nonvolatile semiconductor memory device comprising:
   a memory cell array comprising a plurality of NAND strings arranged therein, each NAND string comprising a memory string comprising a plurality of memory cells connected in series, and a dummy transistor connected to at least one of two ends of the memory string;
   a plurality of word lines connected to respective control gate electrodes of the memory cells;
   a dummy word line connected to a control gate electrode of the dummy transistor;
   a plurality of bit lines connected to respective first ends of the NAND strings;
   a source line connected to second ends of the NAND strings; and
   a control circuit performing an erase sequence, the erase sequence repeating an erase operation to the memory cells and the dummy transistor and an erase verify operation of confirming whether the memory cells and the dummy transistor are changed to an erased state,
   the control circuit being configured to be able to perform, when the erase verify operation is unpassed, a dummy transistor erase operation of selectively changing the dummy transistor to the erased state and a dummy transistor erase verify operation of confirming whether the dummy transistor is changed to the erased state.

2. The nonvolatile semiconductor memory device according to claim 1, wherein
   the dummy transistor is provided at each of the two ends of the memory string.

3. The nonvolatile semiconductor memory device according to claim 1, wherein the control circuit is configured to be able to determine, on a basis of a number of erase operations in one erase sequence, whether to perform the dummy transistor erase operation and the dummy transistor erase verify operation.

4. The nonvolatile semiconductor memory device according to claim 1, wherein
the control circuit is configured to be able to determine, on a basis of a number of write/erase cycles performed to the memory cell array, whether to perform the dummy transistor erase operation and the dummy transistor erase verify operation.

5. The nonvolatile semiconductor memory device according to claim 1, wherein
the control circuit applies, when performing the erase operation, an erase voltage to a well in which the memory cell array is formed, a first word line voltage to the word lines, and a first dummy word line voltage to the dummy word line, the first dummy word line voltage being higher than the first word line voltage.

6. The nonvolatile semiconductor memory device according to claim 5, wherein
the control circuit is configured to apply, when performing the dummy transistor erase operation, an erase voltage to a well in which the memory cell array is formed, a second word line voltage to the word lines, and a second dummy word line voltage to the dummy word line, the second dummy word line voltage being lower than the second word line voltage.

7. The nonvolatile semiconductor memory device according to claim 5, wherein
the control circuit is configured to apply, when performing the erase verify operation, a word line verify voltage to the word lines and a positive voltage to the dummy word line, the positive voltage being higher than the word line verify voltage.

8. The nonvolatile semiconductor memory device according to claim 7, wherein
the control circuit is configured to apply, when performing the dummy transistor erase verify operation, a word line read pass voltage to the word lines and a positive voltage to the dummy word line, the positive voltage being same as that in the erase verify operation.

9. The nonvolatile semiconductor memory device according to claim 7, wherein
the control circuit applies, when performing the dummy transistor erase verify operation, a word line read pass voltage to the word lines and a positive voltage to the dummy word line, the positive voltage being lower than the word line read pass voltage, and the control circuit is configured to be able to arbitrarily change the positive voltage applied to the dummy word line.

10. The nonvolatile semiconductor memory device according to claim 7, wherein
the control circuit applies, when performing the dummy transistor erase verify operation, a word line read pass voltage to the word lines and a positive voltage to the dummy word line, the positive voltage being lower than the word line read pass voltage, and the control circuit is configured to be able to arbitrarily change the word line read pass voltage.

11. The nonvolatile semiconductor memory device according to claim 5, wherein
the control circuit is configured to be able to change, on a basis of a result of the dummy transistor erase verify operation, the first dummy word line voltage and perform the erase operation to the memory cells.

12. The nonvolatile semiconductor memory device according to claim 1, wherein
the control circuit applies, when performing the dummy transistor erase operation, an erase voltage to a well in which the memory cell array is formed and a second dummy word line voltage to the dummy word line, and the control circuit is configured to be able to arbitrarily change the second dummy word line voltage.

13. The nonvolatile semiconductor memory device according to claim 1, wherein
the control circuit is configured to be able to repeatedly perform, when the erase verify operation is unpassed, the dummy transistor erase operation of selectively changing the dummy transistor to the erased state and the dummy transistor erase verify operation of confirming whether the dummy transistor is changed to the erased state.

14. The nonvolatile semiconductor memory device according to claim 13, wherein
the control circuit is configured to perform, after a predetermined number of dummy transistor erase operations, the erase operation and the erase verify operation again.

15. The nonvolatile semiconductor memory device according to claim 1, wherein
the control circuit is configured to perform, after one dummy transistor erase operation, the erase operation without performing the dummy transistor erase verify operation.

16. The nonvolatile semiconductor memory device according to claim 1, wherein
a plurality of dummy transistors are provided at a first end of the memory string and at a second end of the memory string respectively.

17. The nonvolatile semiconductor memory device according to claim 16, wherein
the control circuit applies, when performing the dummy transistor erase verify operation, a word line read pass voltage to the word lines and a positive voltage to the dummy word line, the positive voltage being lower than the word line read pass voltage, and the control circuit is configured to be able to arbitrarily change the positive voltage applied to the dummy word line.

18. The nonvolatile semiconductor memory device according to claim 17, wherein
the control circuit is configured to be able to control the positive voltage applied to the dummy word line separately at respective dummy word lines connected to control gate electrodes of the dummy transistors.

19. The nonvolatile semiconductor memory device according to claim 16, wherein
the control circuit applies, when performing the dummy transistor erase operation, an erase voltage to a well in which the memory cell array is formed and a dummy word line voltage to the dummy word line, and the control circuit is configured to be able to arbitrarily change the dummy word line voltage.

20. The nonvolatile semiconductor memory device according to claim 1, wherein
the control circuit is configured to be able to perform, when performing the erase verify operation, each of a first erase verify operation to even numbered memory cells of the memory string and a second erase verify operation to odd numbered memory cells of the memory string.

* * * * *